US009818631B2

(12) United States Patent
Roberts, Jr. et al.

(10) Patent No.: US 9,818,631 B2
(45) Date of Patent: Nov. 14, 2017

(54) SEMICONDUCTOR DEVICE HANDLER THROUGHPUT OPTIMIZATION

(71) Applicant: CELERINT, LLC., New York, NY (US)

(72) Inventors: Howard Roberts, Jr., Austin, TX (US); LeRoy Growt, Spicewood, TX (US)

(73) Assignee: CELERINT, LLC., New York, NY (US)

( * ) Notice: Subject to any disclaimer, the term of this patent is extended or adjusted under 35 U.S.C. 154(b) by 0 days.

(21) Appl. No.: 15/038,257

(22) PCT Filed: Nov. 25, 2014

(86) PCT No.: PCT/US2014/067347
§ 371 (c)(1),
(2) Date: May 20, 2016

(87) PCT Pub. No.: WO2015/081081
PCT Pub. Date: Jun. 4, 2015

(65) Prior Publication Data
US 2016/0293461 A1    Oct. 6, 2016

Related U.S. Application Data

(60) Provisional application No. 61/909,600, filed on Nov. 27, 2013.

(51) Int. Cl.
*G06F 7/00* (2006.01)
*H01L 21/67* (2006.01)
(Continued)

(52) U.S. Cl.
CPC ...... *H01L 21/67276* (2013.01); *G06Q 10/04* (2013.01); *G06Q 50/04* (2013.01); *H01L 21/68707* (2013.01); *Y02P 90/30* (2015.11)

(58) Field of Classification Search
CPC .................................. H01L 21/67276
(Continued)

(56) References Cited

U.S. PATENT DOCUMENTS 7,183,785 B2   2/2007   Roberts et al.
7,508,191 B2   3/2009   Roberts
(Continued)

OTHER PUBLICATIONS

International Search Report and Written Opinion, dated Feb. 24, 2015, in corresponding International Application No. PCT/US2014/067347.

*Primary Examiner* — Kyle Logan
(74) *Attorney, Agent, or Firm* — Greenblum & Brenstein, P.L.C.

(57) ABSTRACT

A method and system are provided for optimizing operational throughput for a semiconductor device handler having multiple stages. The method includes receiving semiconductor devices for testing at an input carrier buffer, and operating the handler in the testing of semiconductor devices. The method also includes recording operational throughput characteristics for each operational stage of the handler, and analyzing recorded operational throughput characteristics for each operational stage of the handler. Additionally, the method includes determining which operational stage of the handler has the most limiting constraint causing a lowest operational drumbeat, and adjusting operational parameters of the operational stage of the handler that has the lowest operational drumbeat to increase the operational drumbeat. The method further includes repeating the method until an operational state is achieved such that further adjustments to operational parameters result in a decrease in the operational throughput for the semiconductor device handler.

20 Claims, 17 Drawing Sheets

(51) Int. Cl.
*G06Q 10/04* (2012.01)
*G06Q 50/04* (2012.01)
*H01L 21/687* (2006.01)

(58) Field of Classification Search
USPC .......................................................... 700/228
See application file for complete search history.

(56) References Cited

U.S. PATENT DOCUMENTS

| | | |
|---|---|---|
| 7,619,432 B2 | 11/2009 | Roberts |
| 8,400,180 B2 | 3/2013 | Roberts |
| 2004/0164723 A1 | 8/2004 | Bae et al. |
| 2007/0282480 A1 | 12/2007 | Pannese et al. |
| 2008/0041694 A1 | 2/2008 | Rebstock |
| 2009/0309620 A1* | 12/2009 | Roberts .............. G01R 31/2893 324/757.01 |
| 2013/0080760 A1* | 3/2013 | Li ........................ G06F 11/3409 713/100 |

* cited by examiner

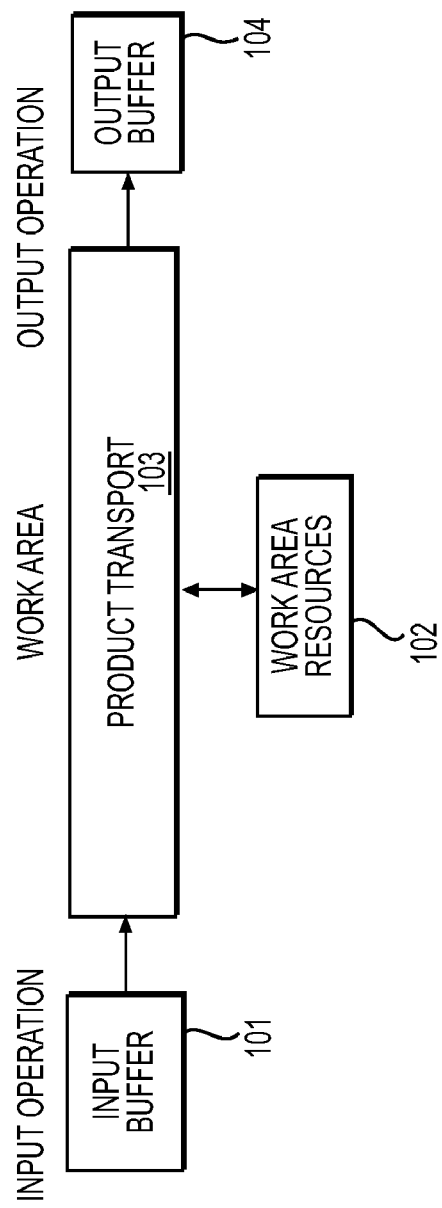

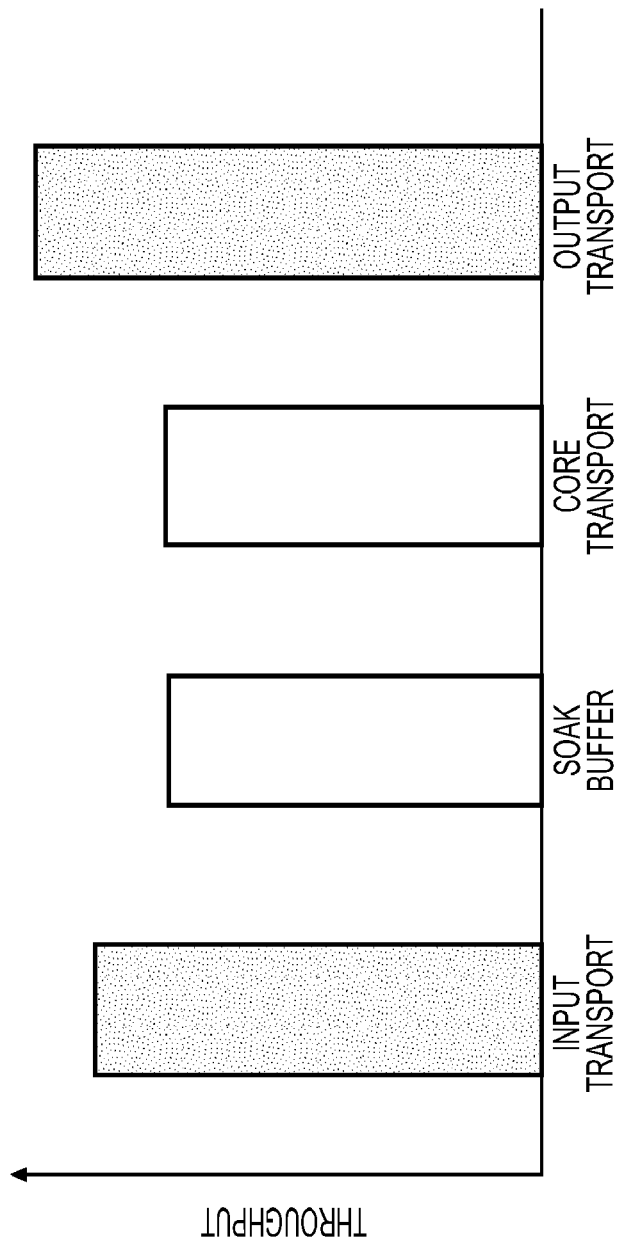

SEMICONDUCTOR DEVICE HANDLER THROUGHPUT OPTIMIZATION

CROSS-REFERENCE TO RELATED APPLICATION

This application claims the benefit of U.S. Provisional Patent Application No. 61/909,600, entitled System and Method For Semiconductor Device, filed on Nov. 27, 2013, the disclosure of which is incorporated by reference herein in its entirety.

TECHNICAL FIELD

The present disclosure relates to automated manufacture systems and methods, particularly automated and robotic semiconductor equipment systems and methods, for testing and manufacture quality control of semiconductors, wherein index timing delays and the overall testing time are reduced to optimize throughput.

BACKGROUND

Optimizing the performance of a semiconductor handler means tuning its mechanical motions so that the semiconductor handler operates at maximum throughput with the slowest mechanical motions for a given test time.

In semiconductor manufacture, semiconductor device test equipment is a costly capital requirement. Conventionally, such test equipment has included a robotic manipulator for handling the devices being tested. This robotic manipulator is commonly referred to as a "handler" and is typically configured with one or more robotic arms referred to as "manipulators." The manipulator mechanically picks up a device for testing, inserts the device into an interface test board and issues a start-of-test signal to the tester. The tester then conducts a test on the device and returns a test result and an end-of-test signal to the handler that causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace the device(s) with the next device(s) to be tested, the tester remains substantially idle. This idle time is sometimes referred to as "index time" for the particular tester and system, and involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manufacturing equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would therefore be a significant improvement in the art and the technology to further reduce index time involved in test operations in manufacturing environments. Particularly in semiconductor manufacture, economic and other gains and advantages are possible if index times are reduced in the testing of semiconductor equipment. It would also be an improvement to provide new and improved systems and methods for achieving reduced index times, without requiring substantial changes or new developments in existing mechanical operations of device handlers and similar robotic or automated components for the testing. Examples of recent advancements made by the present inventor in reducing index time for automated and robotic semiconductor testing are disclosed in other patents by the present inventor, including U.S. Pat. No. 7,183,785 B2, U.S. Pat. No. 7,508,191 B2, U.S. Pat. No. 7,619,432 B2, and U.S. Pat. No. 8,400,180 B2.

In addition to the advantages of reducing index times discussed above, it would also be an improvement to provide new and improved systems and methods for setting up and configuring the control systems for automated and robotic semiconductor test equipment, which further reduces the cost, complexity, index time, and downtime of testing operations associated with the automated and robotic semiconductor test equipment. For instance, conventional automated semiconductor test equipment is commonly serialized, where each individual test is performed sequentially. The primary reasons for serialized testing include thermal issues that restrict the number and complexity of tests that can be conducted at one time, and the complexity of implementation for non-serialized testing. Additionally, conventional Design for Test (DFT) testing normally requires exclusive control of the testing device when running, thus preventing any other non-DFT test from being executed at the same time.

This application applies to handlers in general, but has particular significance for handler technology wherein two or more handlers are multiplexed together to a single tester, or wherein two or more multiplexed handlers are integrated into a single operational unit and connected to a single tester. These systems are referred to as indexless test cells. With indexless systems, the key feature is that there are two or more asynchronous but coordinated core manipulators that can have overlapping insertions for device test. Testing is still performed sequentially, but alternates between the handlers or manipulators. The multiple test sites where these manipulators insert devices for test are electronically multiplexed to the tester. In this way, the elapsed time between tests is minimized.

The benefit of handler optimization is that throughput of the handler is maximized while stress on the handler is minimized. When applied across an entire test floor, this translates to higher throughput per unit area of factory floor space and lower cost of test for the enterprise.

The specific case of an indexless handler transport system presents opportunities for handler optimization that are not present in conventional handler designs. For example, in the case where test time is longer than index time, there is always an opportunity to increase index time without penalty. Whereas with standard handlers that are not input/output (I/O) limited (running at maximum throughput), increasing index time will always result in a reduction of throughput (a penalty) unless there is a secondary result that is sufficiently compensating, such as a lowering of the jam-rate.

The handler motions that are tuned may include, but are not limited to: velocity, acceleration, jerk, path, and sequence. One reason for tuning a robotic handler is to reduce stress on mechanical and electrical components and to thereby reduce the frequency of handler malfunctions and failures. The operational benefit is lower operating overhead. The financial benefit is lower cost of goods sold and higher profit margins.

Many robotic device handlers allow an operator or user to manually adjust the mechanical motions of a semiconductor handler by making changes and adjustments via a software user-interface or control panel. The factors that determine these mechanical motion settings vary from company to company, but often can become a source of controversy, argument, and contention. This contributes to friction between the manufacturing centers that operate the equipment and other company divisions that design, manage, and sell the semiconductor products being tested by the ATE assets. This translates to unnecessary organizational inefficiency. The primary reason for the friction is that there are no clear data for what settings result in the lowest cost of test for the product mix being run on a given handler. Typically, the business centers see the solution as tuning the handlers for the maximum throughput supported by the handler while the manufacturing centers know that the optimal operational speed is slower than the maximum capability of the handler. This optimal point is where a complex set of trade-offs comes into balance and results, over the long term, in the lowest cost of test. These trade-offs include considerations that increase mechanical motions and those that decrease mechanical motions.

The single prime example of the motivation to increase mechanical motions is higher throughput (raw output capacity). Unfortunately, running a handler at maximum speed causes opposing factors to increase in magnitude and frequency. The net effect is to decrease the long-term throughput of the system. A simple example would be the consequence of running a handler so fast that a critical mechanical component fails under the high stresses associated with high-speed operation. When this happens, the operation is halted. Depending upon the mean-time-to-repair, the down time could significantly degrade the long-term throughput to such an extent that the alternative strategy of running more slowly results in higher long-term throughput.

Examples of motivations to slow mechanical motions are those conditions and events that require the handler to be interrupted or halted for long periods of time. These include handler malfunctions, jams, mishandled devices, mean-time-between-failure (MTBF), mean-time-between-assists (MTBA), frequency of required calibrations, and frequency of scheduled maintenance. A simple example of how these factors work against long-term throughput can be made by analogy. Competitive auto racing deals with similar trade-offs in determining a racing strategy. Run the car faster and you may blow an engine or damage a critical component and drop out of competition. However, if you can find the perfect balance between racing speed and stress on the vehicle, the slower racing speeds may put you across the finish line first because the car completed the course without having to stop as often for repairs and adjustments. Essentially, it is a classic example of trading faster instantaneous velocity in exchange for faster speed (average velocity). Ultimately, the team is looking for the optimal point where a complex set of trade-offs comes into balance and results, over the long term, in the fastest speed.

In describing the methodologies used in tuning a semiconductor handler, the Theory of Constraints is employed. Another common term for the Theory of Constraints is the "Theory of Bottlenecks." The Theory of Constraints will be referred to as "ToC." Wikipedia describes ToC as follows: The theory of constraints (ToC) is a management paradigm that views any manageable system as being limited in achieving more of its goals by a very small number of constraints. There is always at least one constraint, and ToC uses a focusing process to identify the constraint, and to restructure the rest of the organization around it. ToC adopts the common idiom "a chain is no stronger than its weakest link." This means that processes, organizations, etc., are vulnerable because the weakest person or part can always damage or break them or at least adversely affect the outcome.

The underlying principles of ToC as they are applied to the optimization of handler performance are described later in this application. However, for the sake of context, some fundamental elements to be leveraged are included below (Key Assumptions, The Five Focusing Steps, and Application) as Wikipedia describes them:

Key Assumptions:

The underlying premise of theory of constraints is that organizations can be measured and controlled by variations on three measures: throughput, operational expense, and inventory. Throughput is the rate at which the system generates money through sales. Inventory is all the money that the system has invested in purchasing things which it intends to sell. Operational expense is all the money the system spends in order to turn inventory into throughput. Before the goal itself can be reached, necessary conditions must first be met. These typically include safety, quality, legal obligations, etc. For most businesses, the goal itself is to make money. However, for many organizations and non-profit businesses, making money is a necessary condition for pursuing the goal. Whether it is the goal or a necessary condition, understanding how to make sound financial decisions based on throughput, inventory, and operating expense is a critical requirement.

The Five Focusing Steps:

Theory of constraints is based on the premise that the rate of goal achievement by a goal-oriented system (i.e., the system's throughput) is limited by at least one constraint. The argument by reduction ad absurdum is as follows: If there was nothing preventing a system from achieving higher throughput (i.e., more goal units in a unit of time), its throughput would be infinite—which is impossible in a real-life system. Only by increasing flow through the constraint can overall throughput be increased. Assuming the goal of a system has been articulated and its measurements defined, the steps are:

(1) Identify the system's constraint(s) (that which prevents the organization from obtaining more of the goal in a unit of time.
(2) Decide how to exploit the system's constraint(s) (how to get the most out of the constraint).
(3) Subordinate everything else to the above decision (align the whole system or organization to support the decision made above).
(4) Elevate the system's constraint(s) (make other major changes needed to increase the constraint's capacity).

(5) Warning! If in the previous steps a constraint has been broken, go back to step 1, but do not allow inertia to cause a system's constraint.

The goal of a commercial organization is: "Make more money now and in the future", and its measurements are given by throughput accounting as: throughput, inventory, and operating expenses. The five focusing steps aim to ensure ongoing improvement efforts are centered on the organization's constraint(s). In the TOC literature, this is referred to as the process of ongoing improvement (POOGI). These focusing steps are the key steps to developing the specific applications mentioned below.

Within manufacturing operations and operations management, the solution seeks to pull materials through the system, rather than push them into the system. The primary methodology use is drum-buffer-rope (DBR) and a variation called simplified drum-buffer-rope (S-DBR). Drum-buffer-rope is a manufacturing execution methodology, named for its three components. The drum is the physical constraint of the plant: the work center or machine or operation that limits the ability of the entire system to produce more. The rest of the plant follows the beat of the drum. They make sure the drum has work and that anything the drum has processed does not get wasted.

The buffer protects the drum, so that it always has work flowing to it. Buffers in DBR have time as their unit of measure, rather than quantity of material. This makes the priority system operate strictly based on the time an order is expected to be at the drum. Traditional DBR usually calls for buffers at several points in the system: the constraint, synchronization points and at shipping. S-DBR has a buffer at shipping and manages the flow of work across the drum through a load planning mechanism.

The rope is the work release mechanism for the plant. Orders are released to the shop floor at one "buffer time" before they are due. In other words, if the buffer is 5 days, the order is released 5 days before it is due at the constraint. Putting work into the system earlier than this buffer time is likely to generate too-high work-in-process and slow down the entire system.

The methodology and principles prescribed by ToC discussed above are useful in understanding the invention described herein.

SUMMARY

The system and method for optimizing operational throughput for a semiconductor device handler described herein represents a significant advance in the design of semiconductor test cells. The systems and methods utilize scientific methodology to the optimization throughput determination. As operational throughput is generally viewed as a long-term metric measured over the operational lifetime of test cell hardware, the issue of long-term reliability must be given equal importance as that of short-term improvements in operational throughput. The optimal balance between short-term throughput and mechanical stress must be found. By implementing the systems and methods described herein, this balance can be determined scientifically and implemented on data instead of human speculation.

In view of the foregoing, various embodiments are envisioned. According to one embodiment of the present disclosure, a method is provided for optimizing operational throughput for a semiconductor device handler. The method includes receiving semiconductor devices for testing at a binned semiconductor device handler input carrier buffer, and operating the semiconductor device handler in the testing of semiconductor devices for a predetermined period of time. The method also includes recording, in an electronic memory, operational throughput characteristics for each operational stage of the semiconductor device handler, and analyzing, by a computer, recorded operational throughput characteristics for each operational stage of the semiconductor device handler. Additionally, the method includes determining, by the computer, which operational stage of the semiconductor device handler has the most limiting constraint, causing a lowest operational drumbeat, and adjusting operational parameters of the operational stage of the semiconductor device handler that has the lowest operational drumbeat to increase the operational drumbeat. The method further includes repeating the method until an operational state is achieved such that further adjustments to operational parameters result in a decrease in the operational throughput for the semiconductor device handler.

In another embodiment of the parallel concurrent test system, when the operational stage of the semiconductor device handler that has the lowest operational drumbeat is determined to be a semiconductor transport operation, the method further determines, by the computer, whether increasing the speed of the semiconductor transport operation would exceed operational limitations of the semiconductor transport operation, by the computer accessing stored operational characteristics of components of the semiconductor transport operation, which are stored in the electronic memory.

In a further embodiment, the method increases the speed of the semiconductor transport operation a predetermined incremental amount, when the computer determines that increasing the speed of the semiconductor transport operation would not exceed operational limitations of the semiconductor transport operation.

In an embodiment, the method decreases the speed of all other operational stages of the semiconductor device handler to match the speed of the semiconductor transport operation, when the computer determines that increasing the speed of the semiconductor transport operation would exceed operational limitations of the semiconductor transport operation.

In another embodiment, when the operational stage of the semiconductor device handler that has the lowest operational drumbeat is determined to be a soak buffer operation, the method decreases the speed of all other operational stages of the semiconductor device handler to match the throughput of the soak buffer operation.

In a further embodiment, the operational stages of the semiconductor device handler include an input transport stage, a soak buffer stage, a core testing operation stage, and an output stage.

In an embodiment, the method includes tuning all core manipulators of the semiconductor device handler to be synchronized with each other, when the semiconductor device handler includes a plurality of core manipulators.

In another embodiment, when any one of the plurality of the core manipulators is determined to have a wait time by pausing and waiting for another core manipulator to complete an operation, the method slows the speed of at least one of the plurality of the core manipulators to minimize the wait time.

In a further embodiment, in the determining whether increasing the speed of the semiconductor transport operation would exceed operational limitations of the semiconductor transport operation, the stored operational characteristics of the semiconductor transport operation include acceptable operational ranges of velocity, acceleration, and jerk.

In an embodiment, increasing the speed of the semiconductor transport operation a predetermined incremental amount is based on a determination of a fastest speed of the semiconductor transport operation limited by a predetermined maximum value for speed, acceleration, and jerk.

In another embodiment, the operational throughput characteristics for each operation stage of the semiconductor device handler are stored in a performance database accessible to the computer, and the computer performs both predetermined operational throughput analysis and user-customized operational throughput analysis for the semiconductor device handler.

In a further embodiment, the method includes issuing user alerts, by the computer, when the computer determines that the operational throughput of the semiconductor handler device is lower than a predetermined level of operational throughput.

In an embodiment, the method includes conducting continuous analysis of operational throughput characteristics for each operational stage of the semiconductor device handler by analyzing data stored in the performance database, determining an abnormal operational throughput characteristic for an operational stage of the semiconductor device handler, and predicting a future failure of an operational stage of the semiconductor device handler.

In another embodiment, the operating of the semiconductor device handler is conducted in a non-production operational mode under various sets of conditions, wherein resulting operational throughput characteristics are used by the computer to generate a recommended semiconductor device handler configuration.

In a further embodiment, each operational stage of the semiconductor device handler is regulated by a digital PID controller.

In an embodiment, the method includes increasing an index time of a semiconductor transport operation when the semiconductor device handler includes an indexless handler transport system and when it is determined by the computer that a semiconductor test time is longer than the index time.

In another embodiment, a semiconductor device handler system is provided for optimizing operational throughput. The system includes a receiving buffer that receives semiconductor devices for testing, and an input buffer that input stages the semiconductor devices prior to testing. The system also includes a core testing station, including at least one manipulator that tests the semiconductor devices, an output buffer for output staging the semiconductor devices after testing, a carrier buffer for storing semiconductor devices after output staging, and a transport system for transporting the semiconductor devices through the system. The system further includes a controller that controls operations of the system, including analyzing operational throughput characteristics for each operational stage of the system, determining which operational stage has the lowest operational drumbeat, adjusting operational parameters of the operational stage that has the lower operational drumbeat to increase the drumbeat, and determining when further adjustments to operational parameters would not result in a decrease in the operational throughput.

In a further embodiment, the input buffer includes a soak buffer that increases the temperature of the semiconductor devices prior to testing.

In an embodiment, the controller is a master digital PID controller, and each operational stage of the system is regulated by a digital PID controller that interacts with the master digital PID controller.

In another embodiment, the core testing station includes a plurality of indexless core manipulators.

BRIEF DESCRIPTION OF THE DRAWINGS

FIG. 1A illustrates a minimal model of a factory;

FIGS. 3A, 3B, 3C, and 3D illustrate a sequence for tuning a standard handler;

DETAILED DESCRIPTION

In view of the foregoing, the present disclosure, through one or more of its various aspects, embodiments and/or specific features or sub-components, is thus intended to bring out one or more of the advantages as specifically noted below. The present disclosure provides a description of a System and Method for achieving Semiconductor Device Handler Throughput Optimization.

In order to apply the methods and principles prescribed by ToC to semiconductor testing, a test cell must be modeled as a factory and the handler as a manufacturing line. FIG. 1A illustrates a minimal model of a factory. In FIG. 1A, the minimal model of a factory comprises an input operation that includes an input buffer 101; a work area that includes various word area resources 102 and a product transport 103 that transports semiconductors from the input operation through the work area to an output operation; and an output operation that includes an output buffer 104.

Figure 1B:
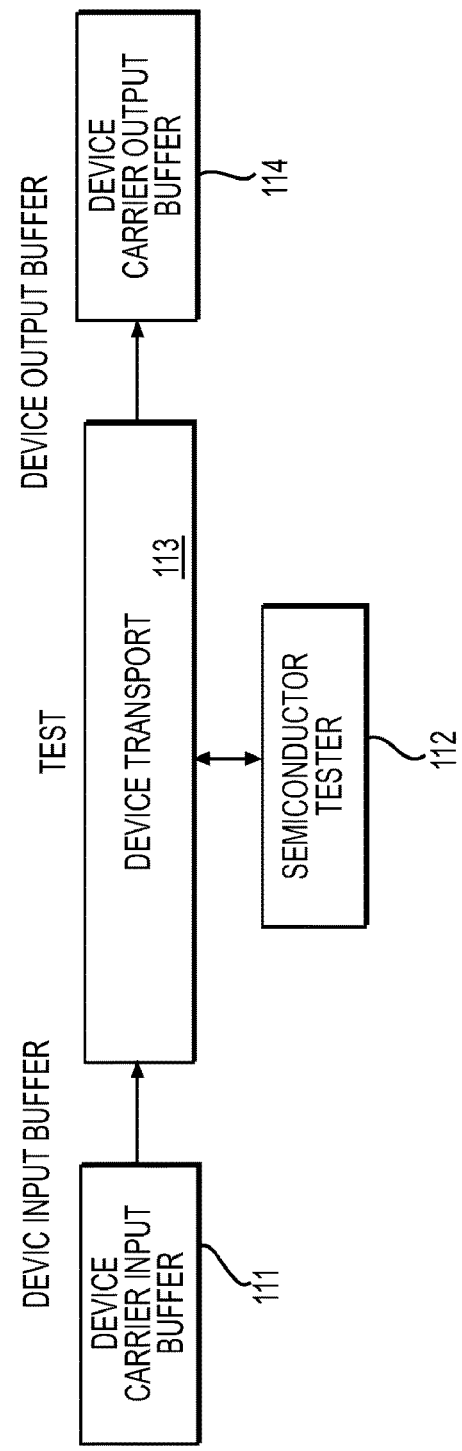
FIG. 1B illustrates the minimal model of the factory in FIG. 1A translated into a minimal model of a handler.

FIG. 1B illustrates a minimal model of a handler that has been translated from the minimal model of the factory shown in FIG. 1A. In FIG. 1B, the minimal model of the handler includes three stages. The first stage is a device output buffer that includes a device carrier input buffer 111. The second stage is a test stage that includes a semiconductor tester 112. A device transport 113 transport semiconductors from the device input buffer, through the test stage, to a device output buffer stage that includes a device carrier output buffer 114.

In practice, the simple model of FIG. 1B does not provide a handler with enough features and performance to support high-volume semiconductor test. Such "work-horse" handlers run continuously with heavy loading. As such, they are required to have high throughput and high reliability. Additionally, the handlers are almost always required to support testing at temperature. Most handlers are ambient and hot (dual temperature) while some device handlers support hot, ambient and cold (tri-temperature handlers).

In order to support these high-volume requirements for semiconductor test, the workhorse handlers have multiple transport systems with buffers between the work areas. In the case of testing at hot or cold temperature, the temperature soak area is itself a buffer. Applying these requirements to the simple model of FIG. 1B, we get an elaboration of the model as illustrated in FIG. 1C.

Figure 1C:
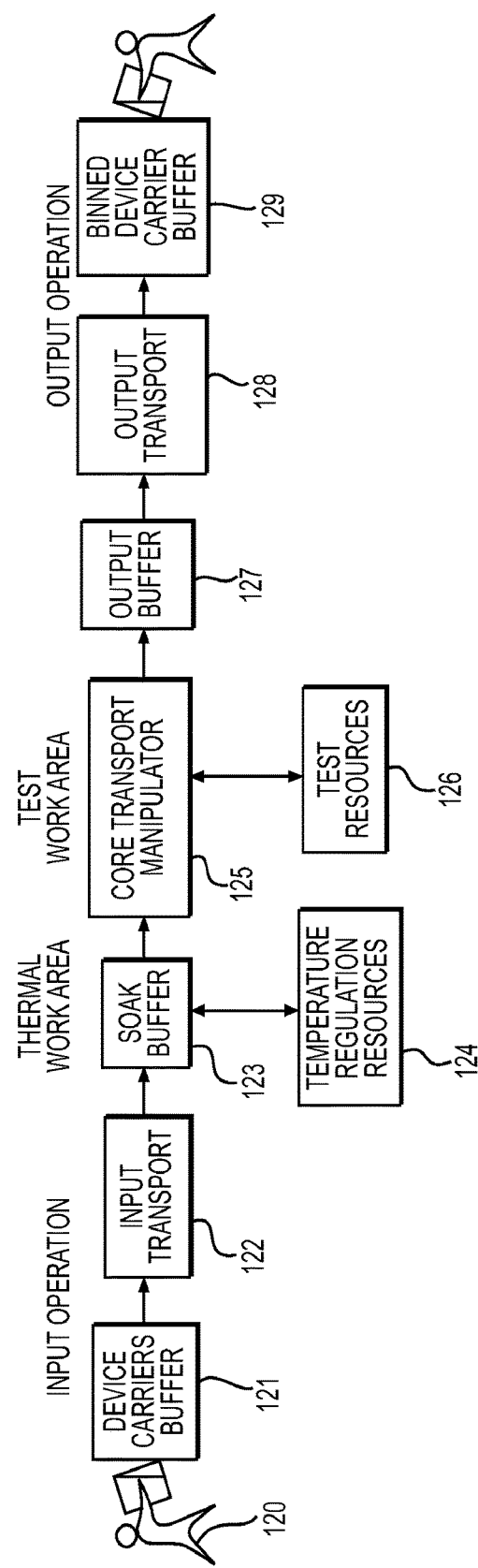
FIG. 1C illustrates an elaborated model of the handler shown in FIG. 1B.

The more functional model of FIG. 1C includes a series of buffers, transports systems, and work areas. Humans 120, 130 are now part of the system as they manually load untested devices into the system and remove tested devices from the system. The input transport moves devices from the input device carrier buffer 121 to the soak buffer 123. The soak buffer 123 is the thermal work area where devices are brought to temperature prior to testing using temperature regulation resources 124. A core transport manipulator 125 moves devices from the input buffer using input transport 122 to the area where they are tested. This typically consists of device "test sockets" into which the devices are inserted by the core manipulator. When the devices are inserted into the test sockets, the devices make electrical connections with the tester's electronic test resources 126. A robotic handler instructs the tester to begin test. When the testing is completed, the tester sends the results back to the handler. In response, the handler retracts the devices from the test sockets and moves them to the output buffer 127. From the output buffer 127, they are moved to the binned device carrier buffer 129, where they are segregated based on the test results. Finally, a human operator 130 moves the binned devices to a location remote from the test cell.

In order to reduce the wide variation in handler design and function into a manageable number that can be described, some basic assertions are made. There are four basic forms of a semiconductor handler: gravity feed, pick-and-place, rotary, and strip-line. The invention described herein will focus primarily on handlers with buffers located between work areas and independent transport systems between buffers and work areas. Among these, the pick-and-place handler is used for illustration purposes; however, the invention is equally applicable to all four basic forms of semiconductor handlers.

Handler maximum throughput is defined as the throughput of the handler when test time is zero. As test time is never zero when the test cell is operating, it follows then, that the constraint for a handler is always at the core operation when the handler is configured for maximum throughput as specified by the manufacturer.

Buffers are defined as device reservoirs that compensate for throughput variations between adjacent operations. Buffer "size" refers to the capacity of a buffer while buffer "state" refers to the portion in use at any given time.

A soak buffer is a special category of buffer where devices must be held while they are brought to a specific temperature prior to test. A soak buffer also operates as a FIFO queue (first-in-first-out queue). In order for the soak buffer to not become the constraint, the system must be able to fill the queue faster than it can be emptied. Again, this requires the core to always have lower throughput than the input transport. This also means that the soak buffer should always remain nearly full. Additionally, the queue must be long enough so that all devices exiting the queue have remained in soak for a time greater than or equal to the minimum soak time. Ideally, the length of the queue would be just long enough so that a set of devices moving through the queue would transit the queue in exactly the same time as the required soak time. In practice, this is rarely possible due to the many unpredictable variations in device size and test time.

The general mathematical relationship for the required queue length (soak buffer size in terms of device count) is given by:

$$\text{Buffer size} = \text{minimum soak time} * \text{core throughput},$$

which is equal to: minimum soak time*(parallelism/(test time+index time))

In a high core throughput example: Parallelism=8, Test time=2 seconds, Index time=1 second, Minimum soak time=2 minutes (120 seconds), and Minimum buffer size=320.

In a low core throughput example: Parallelism=4, Test time=10 seconds, Index time=3 seconds, Minimum soak time=2 minutes (120 seconds), and Minimum buffer size=36.9.

The reason that the soak buffer is described herein is that handlers with temperature support have two states of operation that are relevant in the context of the invention. These are: (1) the period when the buffer is first being filled prior to the first start of test, and (2) the period after the first start of test.

Handler work areas include, but are not limited to these types of operations: (1) Temperature soak (common), (2) Test (always required), (3) Visual Inspection (uncommon), and (4) Laser Mark (highly uncommon). As shown in FIG. 1C, temperature soak and test are the only operations used for illustration purposes. It is important to note, however, that the methods and practices described herein apply regardless of the number of work areas, buffers, or transports.

Leveraging the principles ToC and applying them to a semiconductor test cell, the following definitions are provided:

The semiconductor test cell can be viewed as a factory.

Index time is defined as the time a set of devices under transport at the core spends at the core work area with test time removed. Alternatively stated, core transport time=test time+index time.

There are two basic types of test cells: those that have index time that cannot be eliminated (index-burdened), and indexless test cells. The handler determines whether the test cell is either index-burdened or indexless.

The goal of the test cell is maximum long-term throughput at the lowest cost.

A work area of the handler is a location where devices must wait while they undergo temperature change, test, or modification.

A transport is defined as the set of mechanical, electrical, and control systems required for moving semiconductor devices from one location to the next as they move through the handler.

A manipulator is defined as a transport that operates at the core of the handler where devices are inserted for test.
Operations are Associated with Transport:

Load operation: human loads devices into device carrier buffer; Input operation: transport moves devices from device carrier input buffer to soak buffer;

Core operation: core manipulator moves devices from soak buffer to test and from test to output buffer;

Output operation: transport moves devices from output buffer into binned device carriers; and Unload operation: human transport unloads devices from binned device carrier buffer.

A constraint is defined as the operation or operations that limit system throughput.

The drumbeat is defined as the throughput (devices per unit time) of the constraint.

Removing a constraint means increasing the throughput of the associated operation until it is no longer the constraint or the constraint is shared with another operation.

Balancing an operation means slowing its throughput to match that of the constraint.

Tuning the system means balancing all operations of the system after the existing constraint cannot be removed.

Only index time can be used to remove a constraint at the core or balance the core operation.

Removing constraints is accomplished by increasing the throughput of an operation.

Increasing the throughput of an operation means increasing the transport speed.

Increasing transport speed is either supported by software control and hardware performance specifications, or it is not.

If increasing transport is supported, it can be limited by user preferences or by second and third order throughput reducers.

Second order throughput reducers are those handler malfunction and failures that interrupt handler operation and contribute to an overall, long-term reduction in handler throughput. These include, but are not limited to: device jams, loss of mechanical compliance, electrical and mechanical component malfunction, and electrical and mechanical component failure.

Third order throughput reducers are operator related. Examples include, but are not limited to: failure to load and keep the device input buffer filled, failure to unload and maintain capacity in the output binned device carrier buffer, time-to-assist, time-to-repair, user error, and intentional user programming and configuration.

Transport wait time is defined as a period of zero velocity between the pick point and the place point.

A pick point is defined as the physical location in three-dimensional space where a device is captured and selected for transport.

A place point is defined as the physical location in three-dimensional space where a device is deposited after transport.

Handler throughput is determined by the constraint in the system. Core throughput, by default, is the constraint. Core throughput is determined by test time, index time, and parallelism. Test time and parallelism are fixed when a product arrives at the test cell for testing. Only index time can be adjusted dynamically. Consequently, index time should be minimized as a first order action. Changing the configuration of the test cell to include multiplexed handlers or an indexless handler will nearly eliminate system index time. If the test cell is index-burdened, then index time should be reduced to the extent possible. When the last remaining constraint can no longer be removed, the system should be balanced by matching the throughput of all operations to the throughput of the constraint. This methodology is a focus of the invention described herein.

The invention described herein contemplates optimization of a test cell based on a handler control process modeled on ToC and a set of handler PID controllers that function to regulate throughput. When a constraint can be removed, the process will make a decision based on past performance of the system and the shared experience from other test cells. The shared experience can be, in its simplest form, user-defined settings that limit what the process is allowed to do. In more automated forms, the process can access the output from big-data analytics that sample, organize and process data from a plurality of test cells. Under the latter scenario, an enterprise-level operation could learn from itself and build intelligence. As with all such systems, human oversight is always required.

The purpose of the invention, therefore, is to apply a rigorous and scientific approach to handler optimization, thereby minimizing the uncertainties associated with current methods that rely on incomplete data or speculation.

With standard handlers then, ToC is applied as it is practiced at the factory level: find the constraint and remove it if it can and should be removed. If it can be removed, and a new constraint emerges, continue the process until the last remaining constraint can no longer be removed. Finally, the other operations are slowed to match the drumbeat of the last constraint.

For indexless handlers, the methodologies are similar but the implementation is different. For indexless test cells, standard index time is eliminated (the elapsed time between the end of test and the next start of test). However, indexless test cells are the equivalent of two handlers operating in tandem with electronic multiplexing of two work areas (two equivalent test socket sets) with a single work area resource (the tester). In this scenario, the index time of each individual handler is "hidden" or masked behind the test time of the other handler. So while the test cell, as a whole, experiences no index time, each individual handler does. The index time on each handler (or core manipulator) is then redefined to be the time elapsed between start of disposition to the next insertion. In this case, end-of-test typically coincides with the start of disposition, but device insertion does not necessarily coincide with a start-of-test. Slowing down the individual handler index time eliminates the time elapsed between device insertion and start-of-test, reduces stress on the handler, reduces jam rates, and does so without penalty. This is true because throughput of the test cell is determined exclusively by the test time (index time is hidden).

With indexless handlers, the starting point is different. The method is to proceed directly to the ratio of test time to index time. If test time is greater than index time, then increase index time by setting it equal to the test time. This is achieved by slowing down the core manipulator motions. There is never a throughput penalty for this doing this, but there are benefits including lower jam rates and less handler stress. If index time is greater than test time, then index time becomes a mechanism by which to adjust the core operation should it be a constraint. ToC methods and practices are next applied.

Figure 2:
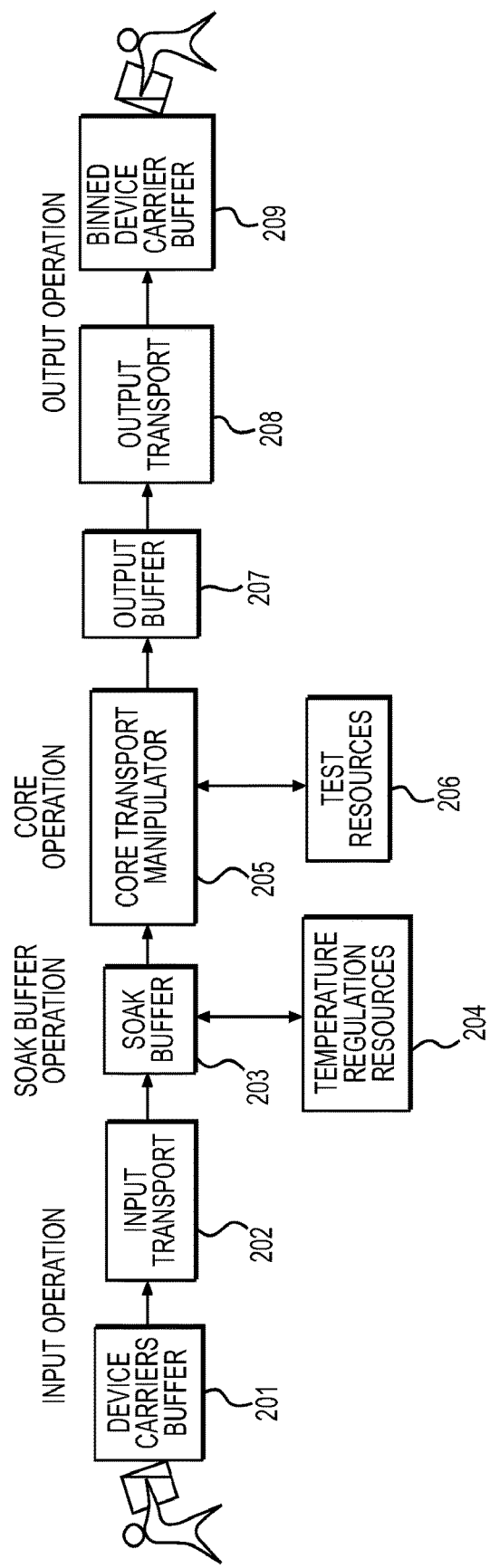
FIG. 2 shows an exemplary illustration of a throughput process for a single core manipulator.

An exemplary illustration of a throughput process for a Single Core Manipulator is illustrated in FIG. 2.

In the Method for a Single Core Manipulator:

Optimization starts once the first set of devices has arrived at the binned device carrier buffer 201.

If the throughput of each operation can be measured by the system, then the constraint is the operation with the lowest throughput. Otherwise, observing what the buffers 201, 203, 207, 209) are doing identifies the constraint.

Unless the constraint is the soak buffer 203, speeding up the transports 202, 205, and/or 208 removes the constraint.

Buffer states serve as a leading indicator that a change of the constraint will occur.

When the constraint can no longer be removed, its drumbeat is calculated.

The system is balanced by slowing all other operations to the drumbeat of the constraint.

Maximum throughput is regulated when the system predicts that long-term throughput will drop in spite of a short-term increase.

(1) In finding the constraint, identify the constraint by comparing the throughput of each operation. This data should be available from the handler controllers.

(2) In finding the drumbeat of the constraint, the drumbeat is the throughput (devices per unit time) of the constraint.

(3) To Remove the constraint or balance the system:
  (a) If a transport operation 202, 205, and/or 208 is the constraint, then increase its speed if it can and should be increased. If not, then slow the throughput of all other operation to match.
  (b) If the soak buffer operation is the constraint, then decrease all other operations to match the throughput of the soak buffer.

(4) Iterate through this process repetitively to completion of the process.

Figure 3A:
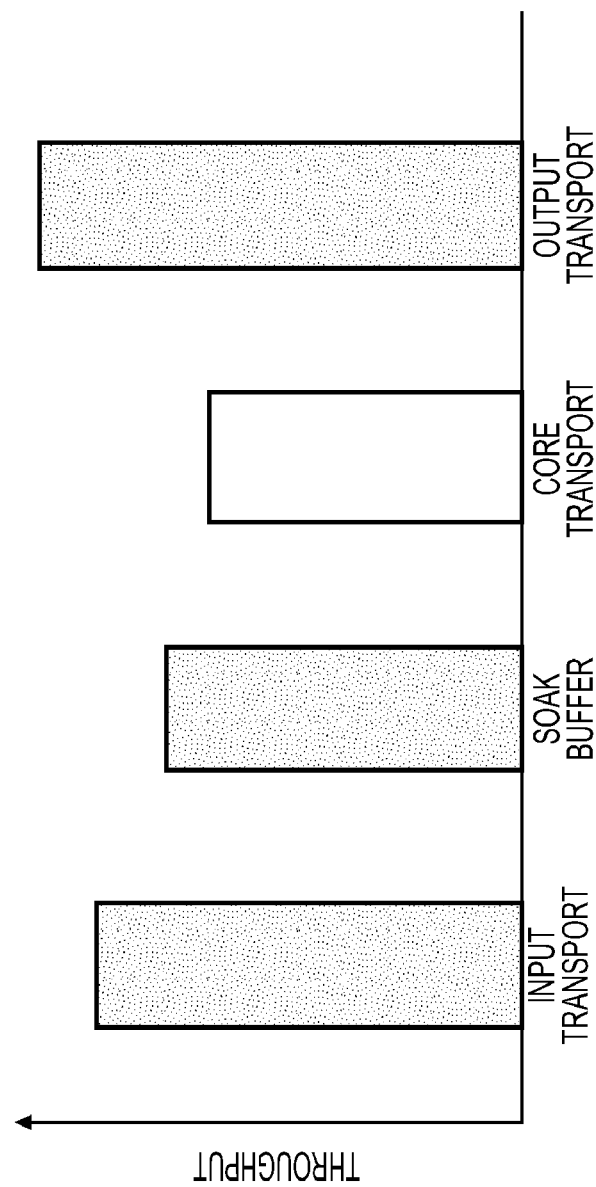
Figure 3B:
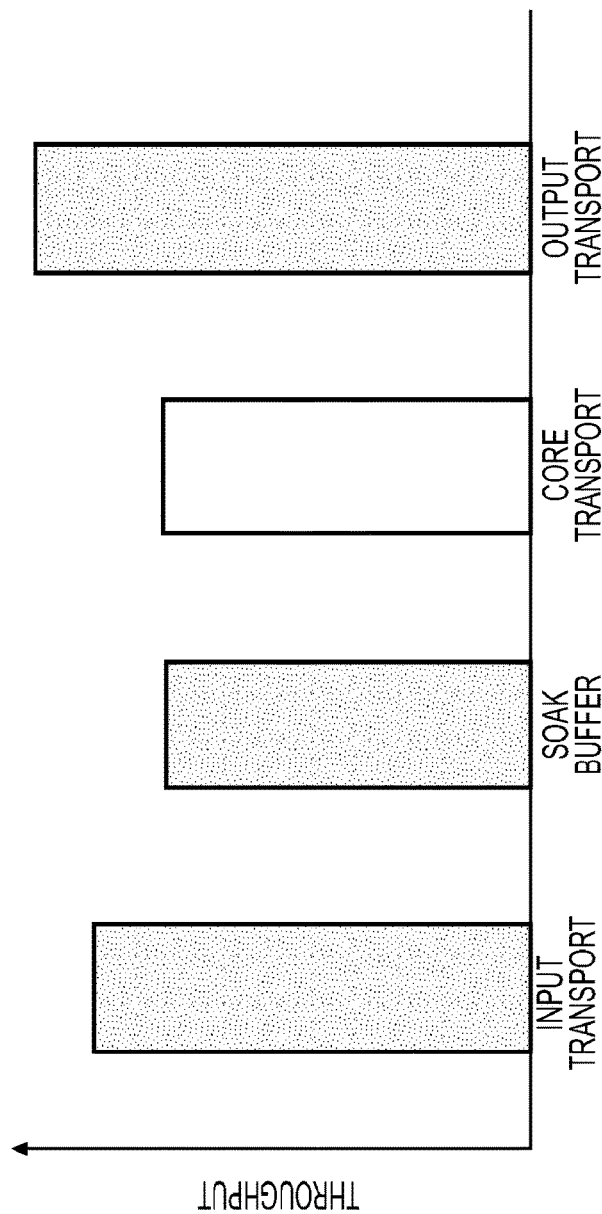
Figure 3D:
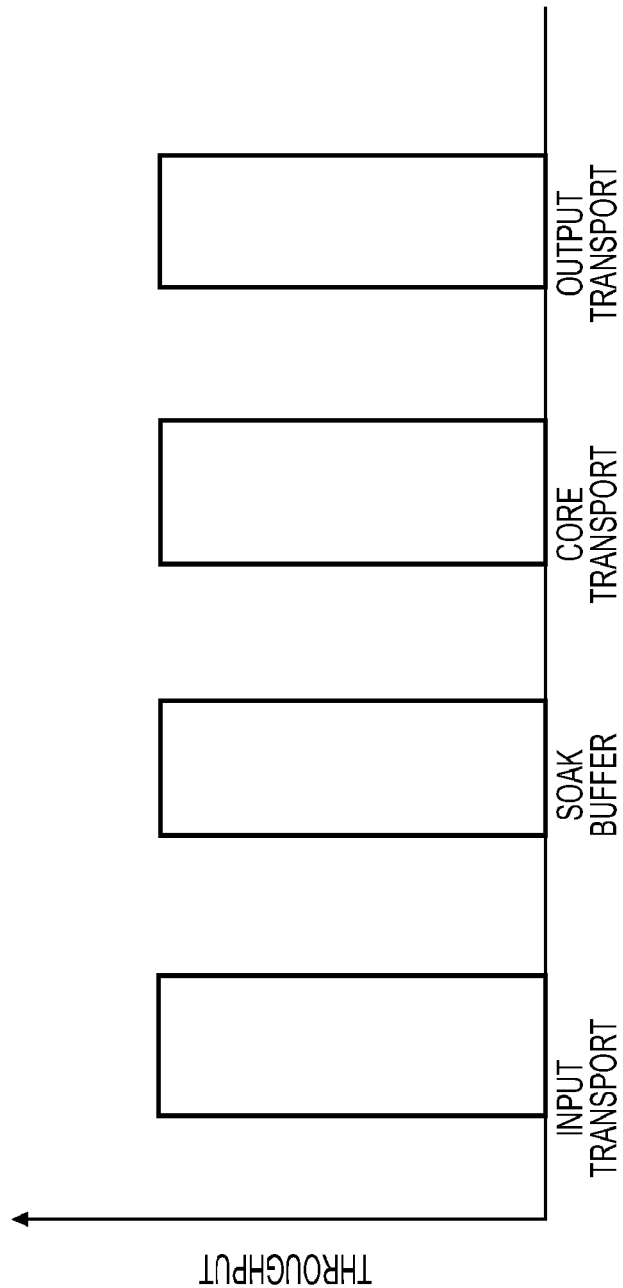

FIGS. 3A, 3B, 3C, and 3D, illustrate a simple sequence for tuning a standard handler. For this example, it is assumed that the system can measure transport speed directly and that the buffer states are not needed to identify the constraint. FIG. 3A shows the throughput of the four operations. As expected, the core transport is identified as the constraint. FIG. 3B shows that the core constraint is removed. The only way to do this is to decrease the index time until it is no longer the constraint. This point is where it matches the throughput of the soak buffer. FIG. 3C shows that the soak buffer and the core are now the constraint. Since the throughput of the soak buffer cannot be increased (unless the soak time can be reduced), it is no longer possible to remove the constraint. FIG. 3D shows that the input and output transports are slowed to match the drumbeat of the constraint. That is, the input and output transports are slowed to match the throughput of the constraint (the soak buffer and the core). The system is now optimized at the highest supported throughput and balanced to minimize stress on the system.

Figure 4:
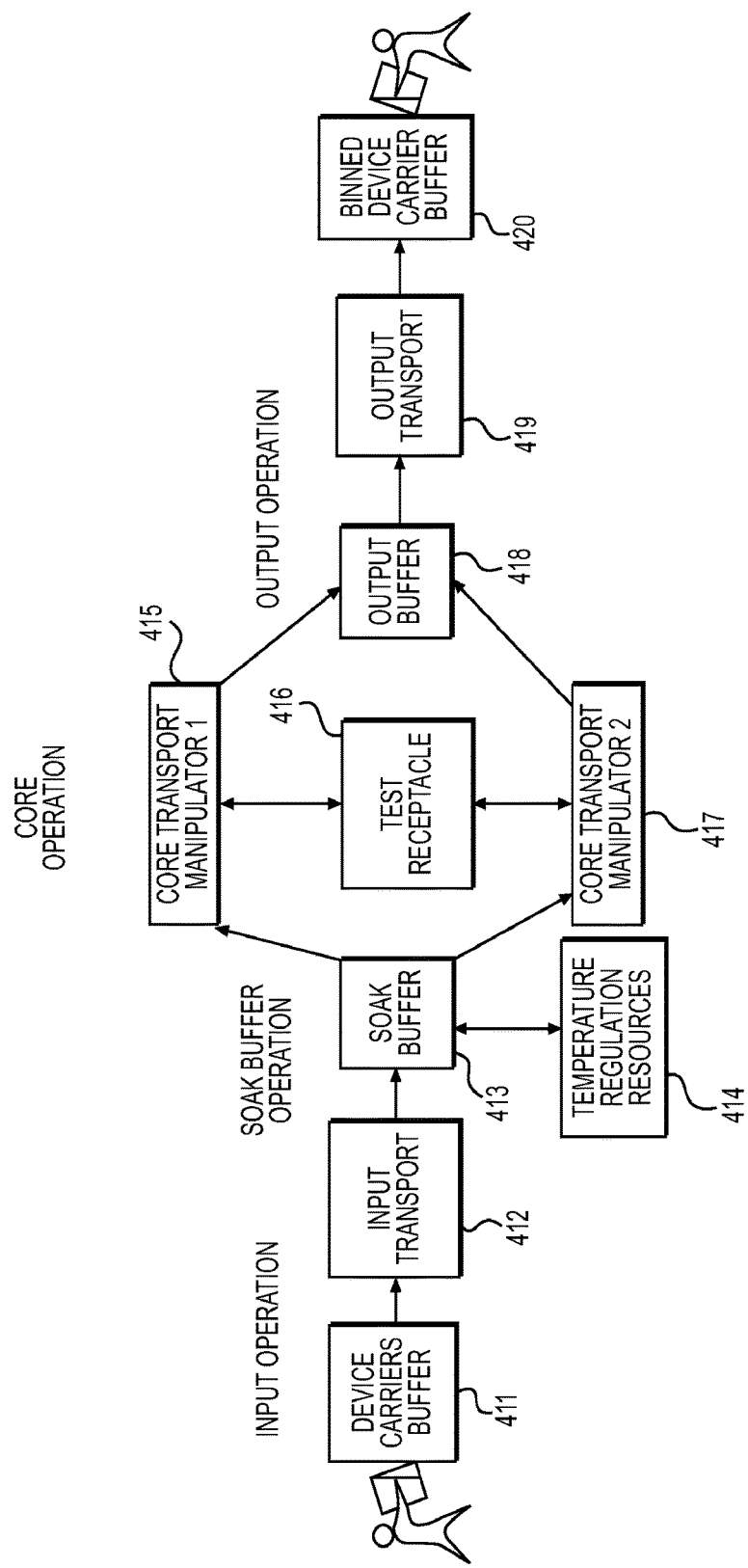
FIG. 4 shows an exemplary illustration of a throughput process for a dual core manipulator.

An exemplary illustration for a throughput process for a Dual Core Manipulator is illustrated in FIG. 4.

In the Method for a Dual Core Manipulator:

Optimization starts once the first set of devices has arrived at the binned device carrier buffer 411.

If the throughput of each operation can be measured by the system, then the constraint is the operation with the lowest throughput. Otherwise, observing what the buffers 411, 413, 418, 420 are doing identifies the constraint.

Unless the constraint is the soak buffer 413, speeding up the transports 412, 415, 417, 419, removes the constraint.

Buffer states serve as a leading indicator that a change of the constraint will occur.

When the constraint can no longer be removed, its drumbeat is calculated.

The system is balanced by slowing all other operations to the drumbeat of the constraint.

The dual core manipulators 415, 417 introduce a requirement for tuning the core manipulators that is completely algorithmic and independent of the constraint.

Maximum throughput is regulated when the system predicts that long-term throughput will drop in spite of a short-term increase.

(1) If the test time, which may utilize the test receptacle 416, is longer than the index time on either manipulator, there will be a wait time at the core. This will appear visually in the form of each manipulator pausing and waiting while the other manipulator completes testing, retracts, and moves out of the core area. This clears the core area and allows the waiting manipulator to resume motion and insert its devices for test. These wait times can be made available from software control process resources. If there is any wait time on the core manipulators, slow their speed and minimize the wait time. There is no throughput penalty for doing this.

(2) In finding the constraint, identify the constraint by comparing the throughput of each operation. This data should be available from the handler controllers.

(3) In finding the drumbeat of the constraint, the drumbeat is the throughput (devices per unit time) of the constraint.

(4) In removing the constraint or balancing the system:

If a transport operation is the constraint, then increase its speed if it can and should be increased. If not, then slow the throughput of all other operation to match.

If the soak buffer operation is the constraint, then decrease all other operations to match the throughput of the soak buffer 413 and the associated temperature regulation resources 414.

(5) Iterate through this process repetitively to completion of the process.

Figure 5:
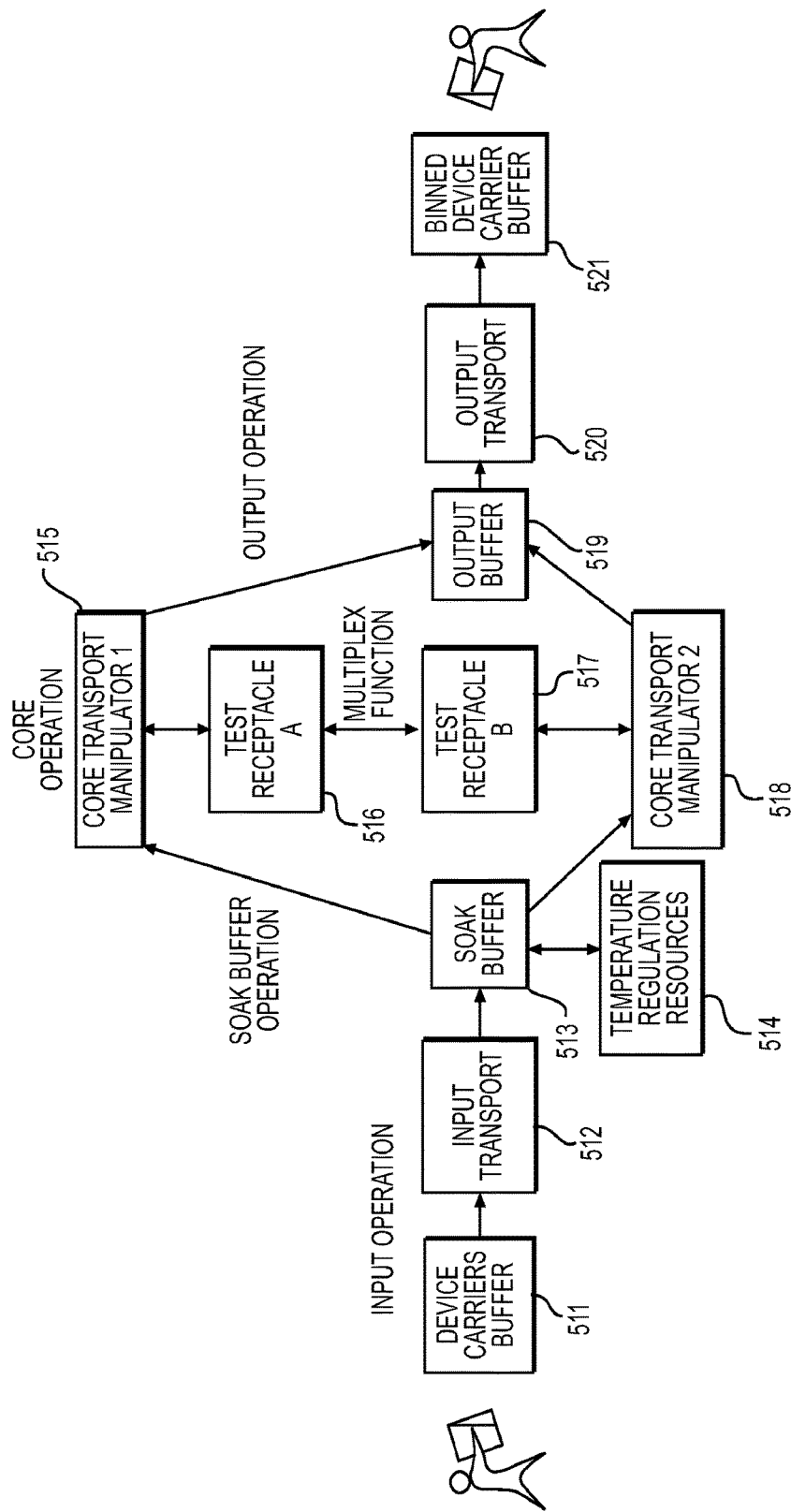
FIG. 5 shows an exemplary illustration of a throughput process for an indexless dual core manipulator handler.

An exemplary illustration of a throughput process for an indexless dual core manipulator handler is illustrated in FIG. 5.

In the Method for an Indexless Dual Core Manipulator Handler:

Optimization starts once the first set of devices has arrived at the binned device carrier buffer 511.

If the throughput of each operation can be measured by the system, then the constraint is the operation with the lowest throughput. Otherwise, observing what the buffers 511, 513, 519, 521 are doing identifies the constraint.

Unless the constraint is the soak buffer 513 and the associated temperature regulation resources, speeding up the transports 512, 515, 518, and/or 520 removes the constraint.

Buffer states serve as a leading indicator that a change of the constraint will occur.

When the constraint can no longer be removed, calculate its drumbeat.

The system is balanced by slowing all other operations to the drumbeat of the constraint.

The dual core manipulators 515, 518 introduce a requirement for tuning the core manipulators that is completely algorithmic and independent of the constraint.

Maximum throughput is regulated when the system predicts that long-term throughput will drop in spite of a short-term increase.

(1) If the test time, which may use one or both test receptacles 516, 517 is longer than the index time on either manipulator, there will be a wait time at the core. This wait cannot be observed visually, but can be detected by the software control process resources. If there is any wait time on the core manipulators, slow their speed and minimize the wait time. This is simply implemented by making the index time equal to the test time. There is no throughput penalty for doing this.

(2) In finding the constraint, identify the constraint by comparing the throughput of each operation. This data should be available from the handler controllers.

(3) In finding the drumbeat of the constraint, the drumbeat is the throughput (devices per unit time) of the constraint.

(4) In removing the constraint or balancing the system:

If a transport operation is the constraint, then increase its speed if it can and should be increased. If not, then slow the throughput of all other operation to match.

If the soak buffer operation is the constraint, then decrease all other operations to match the throughput of the soak buffer 513.

(5) Iterate through this process repetitively to completion of the process.

Tune the System by Intelligently Balancing all Operations to the Constraint:

Currently, when a handler constraint is at the core, the response of the other transport systems is to continue to operate at fixed rates of velocity, acceleration, and jerk. The consequence of this is that wait times are introduced on all other transports not matched to the throughput of the core. Operations feeding the core are blocked and operations clearing the core are starved. These wait times increase the number of acceleration and jerk events during the transit of a transport between the pick point and the place point. These acceleration and jerk events are the moments in time during which maximum stress is experienced by the transport hardware. This applies to motors, gears, belts, and other mechanical systems on which friction, bending, compression, tension, and sheer forces are applied. The system will benefit from a strategy that eliminates unnecessary wait times by redistributing the wait time budget across lower levels of acceleration and jerk while keeping the transit time constant. This effectively tunes all operations to the throughput of the constraint and does so in a manner that minimizes second order throughput reducers. This method of tuning is a focus of the invention described herein.

In a further refinement of the invention, the handler system benefits from a strategy that eliminates wait times by an automatic and algorithmic redistribution of the wait time budget across lower levels of transport acceleration and jerk while keeping the transit time and distant constant. This tunes all operations to the throughput of the constraint but does so in a manner that minimizes second order throughput reducers.

Figure 6:
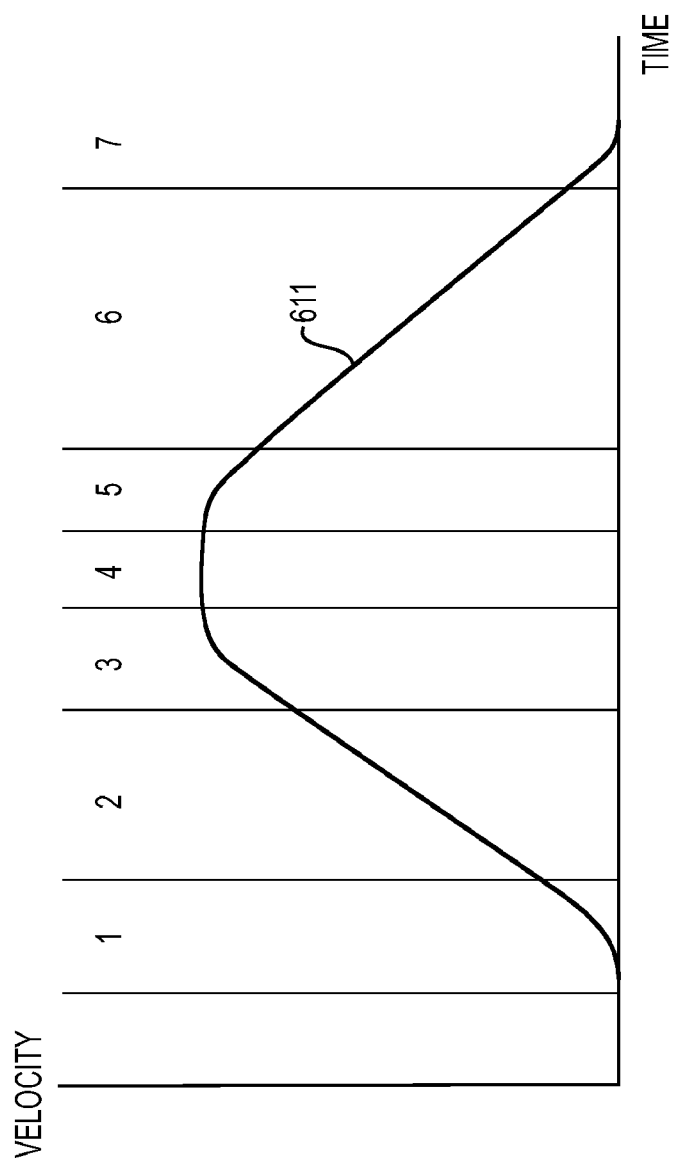
FIG. 6 illustrates an exemplary seven segment motion profile of a handler system.

The current process of motion control is to calculate a motion profile that results in the fastest possible motion within an allowed maximum value for speed, acceleration, and jerk. When this method is used, a motion profile 611 illustrated in FIG. 6 will result. As illustrated in FIG. 6, the process of motion control is to calculate a motion profile that results in the fastest possible motion within an allowed maximum value for speed, acceleration, and jerk.

The motion profile illustrated in FIG. 6 includes up to seven segments, identified sequentially from 1 to 7, that are defined by the following:

Segment 1: Acceleration build-up, with positive jerk.
Segment 2: Constant acceleration (zero jerk).
Segment 3: Acceleration ramp-down, approaching the desired velocity, with negative jerk.
Segment 4: Constant speed (zero jerk, zero acceleration).
Segment 5: Deceleration build-up, approaching the desired deceleration, with negative jerk.
Segment 6. Constant deceleration (zero jerk).
Segment 7. Deceleration ramp-down, approaching the desired position at zero velocity, with positive jerk.

In this motion profile 611, if the initial and final positions are sufficiently close together, the maximum acceleration or maximum velocity may never be reached.

The problem with this approach to the calculation of a motion profile is that it attempts to minimize the transit time (the end of period 7) under the conditions of limiting maximum velocity, acceleration, and jerk. This approach is acceptable when attempting to maximize throughput. In this case, time should be minimized. However, it is suboptimal when the transit time and distance are fixed and the objective is to minimize the forces of stress. These conditions exist on current handler technology when an operation is blocked or starved and wait times are introduced. This will also occur when ToC is applied and the throughput of an operation is slowed to match that of the constraint. In either case, the current process results in the introduction of wait times into a transport cycle. If wait times are not introduced it is only due to manual reconfiguration of the transport speeds.

In the case where an operation is starved or blocked due to human causes, the wait time cannot be predicted. In this case, there is no alternative and the wait time must by necessity be introduced. There is no alternative. For example, when a user fails to load devices into the device carrier input buffer, all other operations downstream can become starved for devices and may, if enough time elapses, come to a complete stop across all operations. A mitigating solution for this is discussed later in the description of the invention, but ultimately it requires human assistance.

In the case where the throughput of an operation is slowed to match that of the constraint, the wait time can be predicted. It is the difference in the transit time of the current throughput and the transit time of the throughput required to match that of the constraint. Since the new transit time is known and fixed, it is now possible to design the motion profile to minimize jerk (stress) under the conditions of fixed time and distance. More importantly, it is possible to eliminate the wait time by taking this time and consuming it in lower rates of jerk and acceleration. This method is the focus of the following refinement of the invention.

Figure 7:
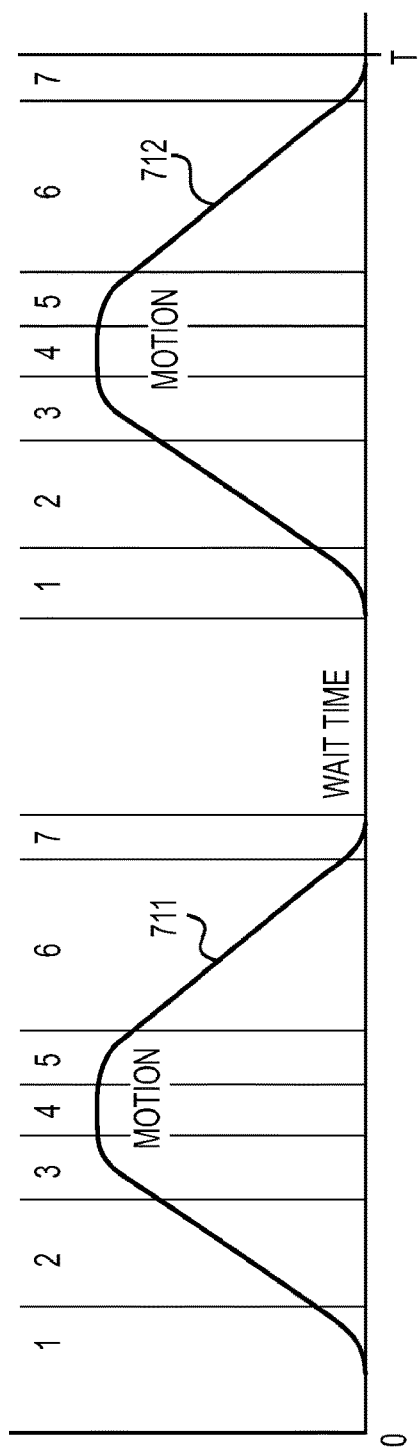
FIG. 7 illustrates an exemplary composite motion profile of a handler system that includes wait time between seven segment motion profiles.

Assuming that the throughput of an operation must be slowed to match the throughput of the constraint, the current process is to introduce wait times. This is the same method used when an operation is starved or blocked. FIG. 7 illustrates a general example of a motion profile when a wait time has been introduced between seven segment motion profiles 711, 712. Referring to FIG. 7, the curved line is the motion profile given by velocity as a function of time, v(t). T gives the total transit time. The throughput is given by parallelism/T. The distance traveled is given by $\int_0^T v(t)dt$.

Is there a better and optimal motion profile that minimizes the stress on the transport system while holding T constant? The answer is yes and the method is given by the following analysis where C is the area under the curves shown in FIG. 7. Gamma is the constant that must be solved. Once gamma is known, a new $C^\infty$ motion profile is described by the three-segment, piece-wise equation for the optimal velocity profile. Although the method is performed piece-wise, the resulting function from 0 to T is continuous. Furthermore, there are now only three segments in the profile as opposed to 7, as before. There are also no periods of constant acceleration.

A mathematical analysis and solution to determining an optimal motion profile for minimizing jerk is illustrated below:

Minimizing the $L^\infty$ norm of jerk

Abstract

The problem is:

Find the velocity $v(t)$ satisfying

-continued $$v(0) = v'(0) = v(T) = v'(T)$$

with $$\int_0^T v(t)dt = C$$

which minimizes $$\|v''\|_{L^\infty(0,T)}.$$

Solution

The answer is ...

$$v(t) = \begin{cases} \frac{\gamma}{2} \cdot t^2 & \text{for } t \in \left[0, \frac{T}{4}\right] \\ \frac{\gamma}{2} \cdot \left(\frac{T^2}{8} - \left(t - \frac{T}{2}\right)^2\right) & \text{for } t \in \left[\frac{T}{4}, \frac{3T}{4}\right] \\ \frac{\gamma}{2} \cdot (t - T)^2 & \text{for } t \in \left[\frac{3T}{4}, T\right] \end{cases}$$

where $\gamma > 0$ is chosen to satisfy the condition $$\int_0^T v(t)dt \equiv C.$$

Notice that $|v''(t)| \equiv \gamma$ for all $t$.

Persons skilled in the art will understand that this solution provides a method for designing a motion profile for minimum jerk when C and T are known and that minimizing jerk will minimize acceleration and ultimately minimize stress on the system.

An automated method of algorithmic control is now proposed. When applying ToC to optimizing the throughput of a semiconductor handler, wait times are removed from the motion profiles of transport systems and replaced with continuous and uninterrupted motions as just described.

Figure 8:
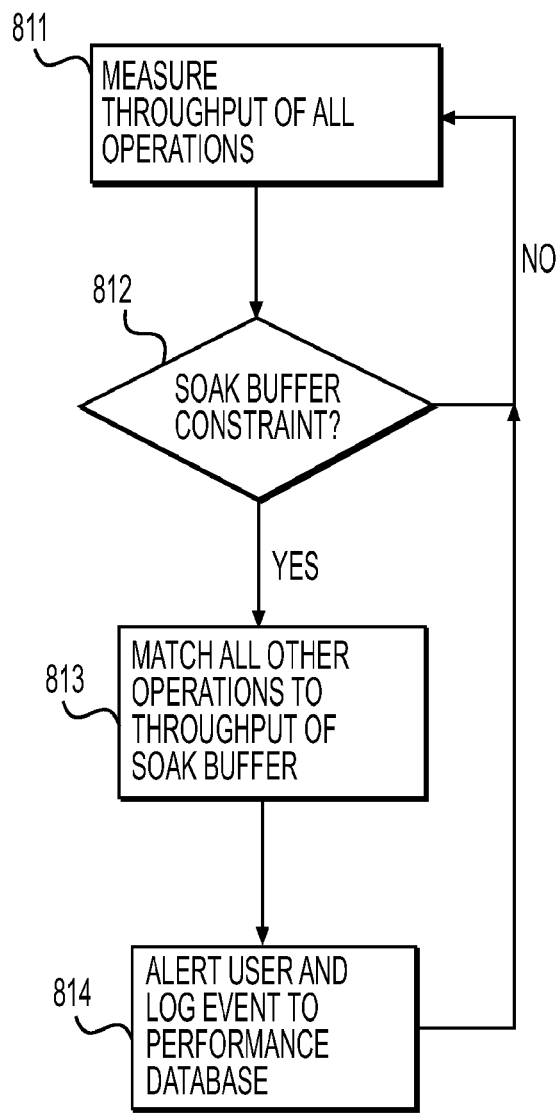
FIG. 8 illustrates a flowchart for optimizing throughput when temperature soak time becomes the constraint.

Automatically Tune the System when Soak Time is the Constraint:

The situation may arise where temperature soak time becomes the reason the constraint moves from the core to the soak buffer work area. This is a case where the soak buffers fails to perform as a buffer. Wait times are introduced on the input transport system as it is blocked, and wait times are introduced at all downstream operations as they are device-starved. This is not controlled balancing of the system based on principles prescribed by ToC. This is precisely the problem that ToC attempts to address. Relying on blocking and starving to control throughput in the system is inefficient and mechanically stressful. It also suggests that the specific handler choice may not be the best one for the given device requirements. However, because no feedback and no data are provided to the user regarding this condition, the user is neither alerted nor informed. As a refinement of the invention, FIG. 8 illustrates a partial flowchart for optimizing throughput when temperature soak time becomes the constraint. This will allow the user to make informed decisions regarding corrective action options and do so at the earliest point in time.

Figure 9:
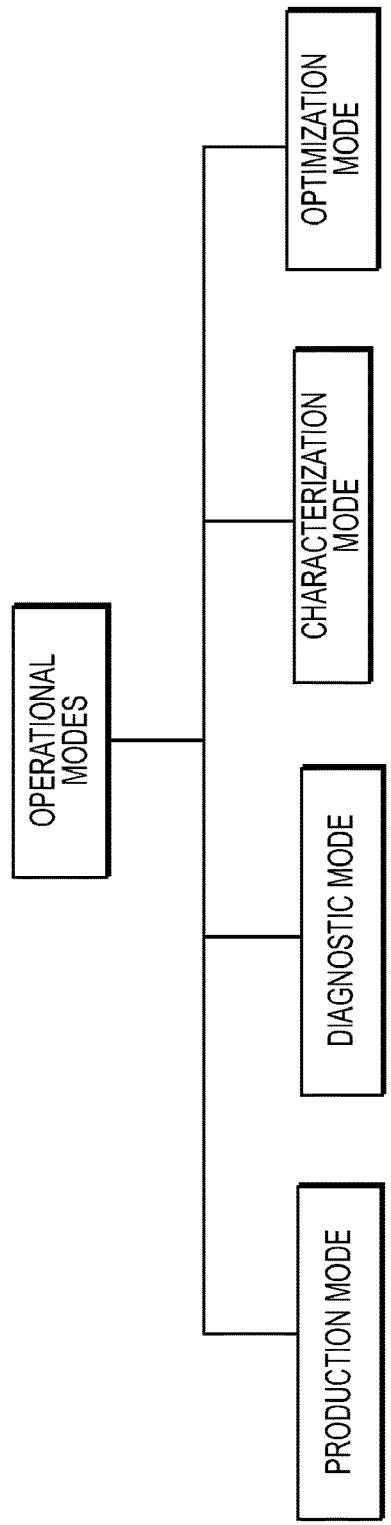
FIG. 9 shows a basic illustration of a system having several operational modes, including non-production operational modes.

In FIG. 9, the throughput of all operations are measured at block 811. At decision block 812, a determination is made whether the soak buffer is the constraint. If the soak buffer is not the constraint, then the system resumes measuring the throughput of all operations, at which time the process will branch to other processes described herein. If the soak buffer is the constraint, however, then the process matches all other operations to the through put of the soak buffer, as illustrate in block 813. At block 814, the process alerts the user and logs the event into a performance database, before proceeding to other processes described herein.

Staged Alert System to Avoid "Brick-Wall" System Halts:

When the handler constraint is due to failure on the part of the user to load device carriers into the system or unload binned device carriers from the system, the current process is to issue an alarm when the throughput of either operation drops to zero and the system is halted. Assistance from the user is required to remove the constraint and resume operation. This is an example of a "brick-wall" problem. There is no "early warning" system alerting the user that the problem is approaching so that proactive action can be taken in advance of a complete system halt. The current art relies exclusively on a visual inspection of the device carrier buffers to identify the approaching interruption. The art could benefit from an automated system implementing a staged response wherein the user is informed through a series of early warning alerts with the purpose of preventing a system halt. The system would be based on the instantaneous buffer state as well as a $1^{st}$ order derivative rate of change. The architecture of this system can be based on a proportional-differential feedback controller.

Such a system is contemplated herein and is described by, but not limited to, the following set of rules:

If a buffer begins to empty at or near the rate of the downstream throughput, an alert is immediately issued indicating that the buffer is being starved by an upstream operation.

If a buffer begins to fill at or near the rate of the upstream throughput, an alert is immediately issued indicating that the buffer is being blocked by a downstream operation.

The alert includes an estimated time to a "brick-wall" event. This provides the operator with a minimum time to assist requirement in order to keep the system running at current throughput.

A system with additional stages in the escalation process is contemplated. An example is when the system has some fixed time-interval from being interrupted, an alert is issued accordingly.

All alerts and the response time of the user are sampled and logged for future analysis.

Non-Production Operational Modes—Characterization Mode:

The current process is for a handler to be configured based on the device under test and for it to be adjusted during operation by the user, based on its performance. The current process could benefit from non-production operational modes. For example, the handler will characterize its own performance under a given set of conditions and records, analyze, and report the data and results to the user. The data would be taken while the handler varies a matrix of operational parameters such as test time, index time, throughputs, jerks, accelerations, velocities, and insertion forces. The outcome of this characterization will be to more accurately identify the operational "sweet spot" of the handler and provide configuration recommendations based on empirical data. As these operational settings and their complex interaction are a source of both system inefficiency and organizational friction, the current process could benefit greatly from features similar to the one just described. This is not currently available and the method and is a focus of the invention described herein.

For systems described herein where ToC is applied to optimize performance, there is certainly an opportunity to have multiple modes of operation. For example, in addition to a normal operating mode, it is contemplated that a characterization mode would exist that algorithmically characterizes handler performance over a matrix of settings, such as transporter speeds and target buffer states while measuring jam-rates and long-duration throughput. This data could then be used to identify the best settings for maximum long-duration throughput. The data would also produce correlation between all of the input variables and outcomes. This data would be highly valued in terms of removing the uncertainties associated with handler setup and operation. An example of the information resulting from such a characterization would be that the instantaneous throughput where second order effects such as jam-rates begin to reduce the long-term throughput could be measured with relative precision. This number would then be used as the target throughput in the user preferences.

As an additional example of operating modes, an optimization mode is contemplated that would be automatically enabled upon a rise in jam-rates above some predetermined threshold in the user preferences or above some predetermined rate-of-change (1st order derivative of jam-rate) in the user preferences. The system would respond by modulating the throughput while measuring jam-rate sensitivity to transport speeds. The outcome of this test would be valuable information to the maintenance personnel in determining if the problem requires maintenance or if it is a simple matter of reducing the handler throughput. For example, if the throughput is slowed in a series of steps while the jam-rate remains constant, then the problem is independent of transporter speed. The result would be to resume normal operational throughput until the handler can be taken off-line, diagnosed, and repaired. If the jam-rate shows significant sensitivity to the transporter speeds, then the solution might be to reduce the transport speeds and thereby the jam-rate at the same time. This could very well return the handler to compliance for long-term throughput criteria. It would even be possible to enter the time to assist and the time to repair and have the system make a decision on what to do based on the long term impact on throughput over a specified period of time. For example, if the operation needs X number of units tested by a certain time in the future, is it better to offline the handler and repair now or should the handler continue running but at a slower throughput rate in order to meet the goal? A handler as just described would have all of the data necessary to make that calculation once it is provided the production requirements as inputs.

Figure 10:
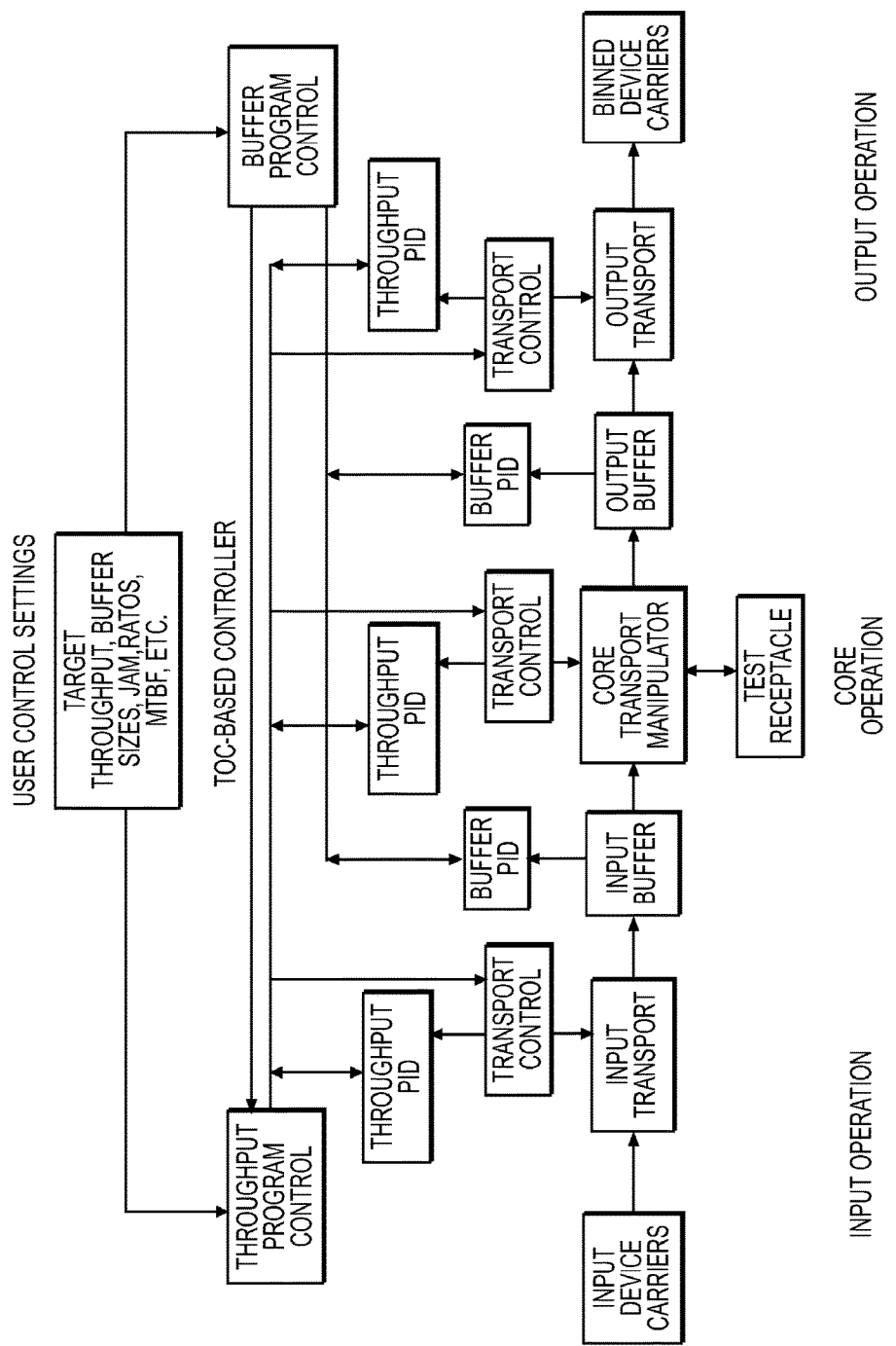
FIG. 10 provides an exemplary illustration of a system for using a ToC-based controller to optimize throughput of a semiconductor device handler system using PID controllers.

FIG. 10 shows a basic illustration of a system having several operational modes, including non-production operational modes. In FIG. 10, the operational modes illustrated include a production mode, a diagnostic mode, a characterization mode, and an optimization mode.

Leverage Data-Science:

Handler throughput is seldom the maximum throughput supported by the system software and hardware. The actual throughput is typically a result of direct human intervention. This intervention takes the form of deliberate reprogramming of the handler to operate below maximum throughput. The reasoning is based on a complex combination of opinion, speculation, historical data of cause and effect, and occasionally for simple reasons of convenience or expediency. The programming of handler throughput can benefit from a more scientific and methodical approach. Most handler systems have the capacity to provide operational data that can be analyzed in both real-time and off-line modes to more accurately optimize handler performance for maximum long-term throughput. This is not currently being done in a rigorous and scientific method and is a focus of the invention described herein.

As handler status and state are being sampled and recorded, it is contemplated that all of these setting will be included in the data set for analysis. As persons skilled in the art will understand, capturing and analyzing this complex set of variables in order to compute meaningful and helpful manufacturing data is possible only with the support of an automated system. It is simply too complex for human operators to observe, record, and analyze without computer-aided assistance.

It is contemplated that the data sampled during handler operation will be captured and logged to data file for analysis. Combining this data with operator and maintenance logs of the test cell operation, information will be generated that helps improve the robustness of the ToC-based master control process. The results of this analysis can be correlated with other test cell data such as package type, device kit type, and historical data to further improve the process.

Additionally, it is contemplated that when this information is compared and correlated across a fleet of test cells, the test cells can learn from each other. Essentially, they evolve a collective experience that can be shared and leveraged to more effectively achieve the goal of the enterprise. This process can certainly employ big-data analytics and is enabled by automated data collection of settings (decisions) and results (outcomes) as they relate to handler operational efficiency. This will then allow the managing of handler assets to become more scientific in nature and further removed from speculation and opinion.

It is contemplated that an event log is maintained that includes, but is not limited to, the following types of data:
    All user programmable settings
    Event time-stamps
    All events resulting in a change of system status
    All events resulting from user intervention
    All performance metrics
    All buffer sizes and states
    All throughput states
    All downtime events and durations
    All offline and online events and durations
    Yield histories
    All temperature histories
    All device jams
    All system failures
    All system malfunctions of any type
    All warnings
    All alerts
    User names and/or identifications
    System locations
    Handler and tester identifications
    Device identifications
    Kit identifications
    Test times
    Index times
    General Handler Design Considerations:

A key question is what determines when a constraint can no longer be removed. If a constraint has hit a "brick wall" and cannot be removed because faster throughput is simply not supported by the system, then the answer is that the constraint cannot be removed. However, if faster throughput is supported, then the answer requires the system to predict future behavior based on current and past performance. Will a short-term increase in throughput stress the system and ultimately decrease long-term throughput? In order to answer this, electronic memory is required to store and retrieve past events, decisions, and outcomes. The capacity to share and learn from past experience also serves the robustness of such a system.

The general method for optimizing the performance of other handler models will always follow the fundamental methods prescribed by ToC. As the buffer states are used as a feedback control mechanism for the adjustments in mechanical motions, every handler is expected to have buffers of some type.

Some handler models pick and place directly to and from the device carries. In these cases, the device carriers represent the buffers. The input buffer is manually filled but emptied by a robotic transport. The output buffer is manually emptied but filled by a robotic transport. Where human operators are involved, it may not be possible to know if the buffers are changing. Although it will always be possible to detect an empty input condition or a full output condition, the regulating system should rely more on detecting throughput and wait times at each operational stage rather than buffer state.

It is contemplated that the regulating systems at each operation stage of the handler (input, core, and output) will be implemented using a digital PID architecture with the sampling rate equal to the test cycle time. This is the time elapsed between starts-of-test. The PID controllers must ignore rapid changes that occur cycle-to-cycle (noise), respond to both past events and to predicted behavior. In this regard, PID control architecture is a logical solution and is expected to provide robust regulation. ToC will provide the high-level controls that identify the constraint, if it can be removed, if it should be removed, and when the other operations should be slowed to match the drumbeat of the constraint. A PID implementation is contemplated at each operational stage in order to maintain each buffer at their targeted set point. Furthermore, a PID implementation is contemplated at each operational stage in order to regulate throughput of each operational stage.

Figure 10A:
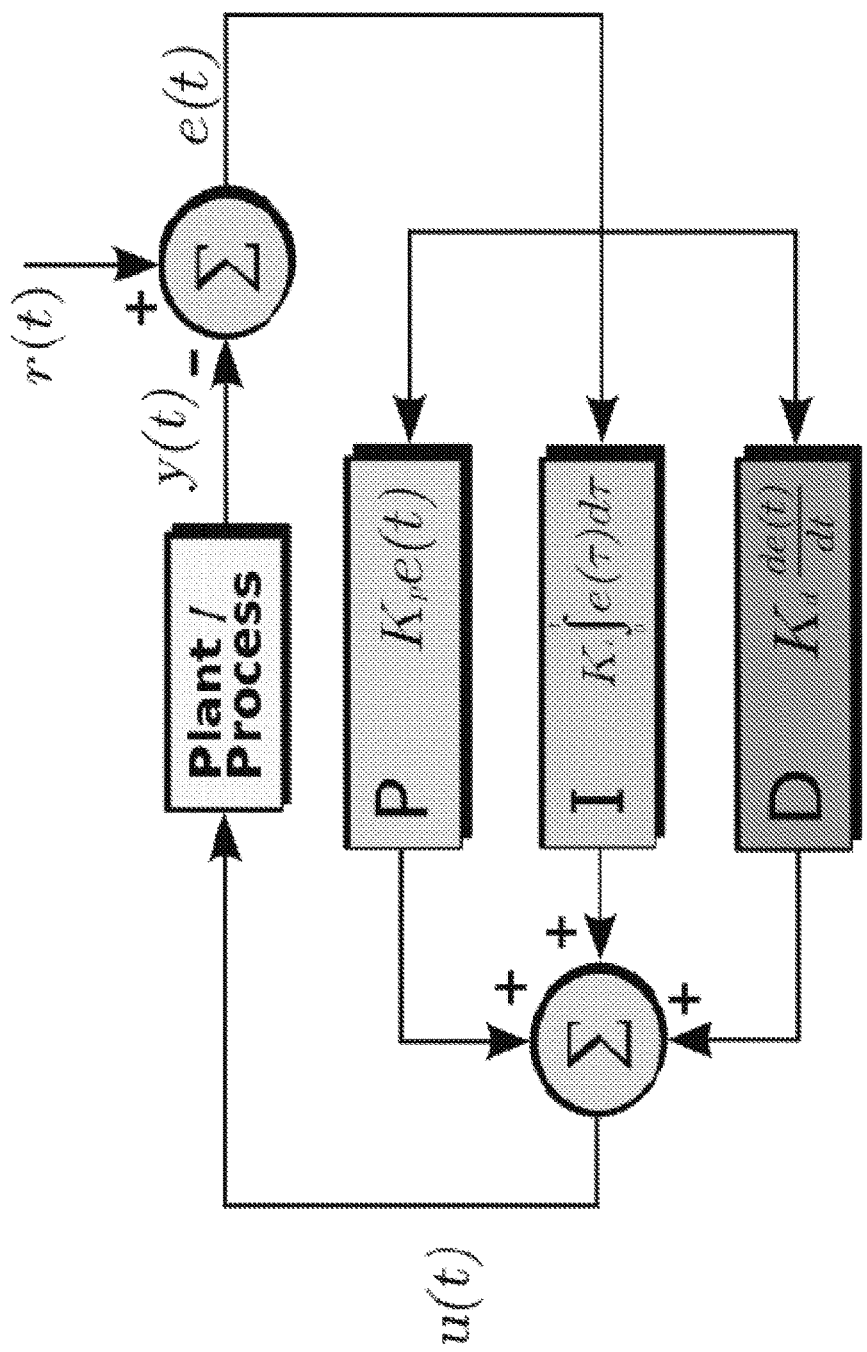
FIG. 10A provides an example of a PID implementation in a digital PID architecture.

An example of a PID implementation in a digital PID architecture, as suggested by Wikipedia, is illustrated in FIG. 10A. The following assignments would apply in a control loop designed to regulate buffer size:

y(t): buffer size
r(t): targeted buffer size
e(t): r(t)−y(t)
u(t), transport speed control. (Source:http://en.wikipedia.org/wiki/File:PID_en_updated_feedback.svg).

The PID coefficients would be set based on factors to be determined by a particular handler setup, but will result in varying levels of priority among current performance (P), past-performance (I), and predicted performance (D). For example, a higher D coefficient ($K_d$) will increase response sensitivity to short term events that can cause abrupt changes in the buffer size. Lowering $K_d$, results in a system less sensitive short-term noise. $K_i$ and the integration limits would be used to adjust system sensitivity to long-term events from the past that affect buffer size such as jams, failure of the operator to load device trays into the handler input, and mechanical failures. The proportional term, $K_p$ should contribute to the bulk of the output, u(t).

In the case of a PID controller designed to regulate throughput, the following assignments would apply:

y(t): measured throughput
r(t): targeted throughput
e(t): r(t)−y(t)
u(t), transport speed control.

The PID controllers that regulate throughput serve to maintain the targeted throughput under varying loads on the transport systems. For example, the output transport will come under increasing load when yield drops. This is because it must travel longer distances to get to the reject bins. In this case, the PID error function will increase and the output, u(t), will request that the motions of the transport increase in speed to compensate.

FIG. 10 provides an exemplary illustration of a system for using a ToC-based controller to optimize throughput of a semiconductor device handler system, similar to the systems previously described, by using PID controllers illustrated therein. Persons skilled in the art will understand that there are many architectures, components, algorithms, and configurations that will provide the necessary controls to optimize a semiconductor handler using PID controls and methods described in the Theory of Constraints. The system illustrated in FIG. 10 is one of many possible high-level models.

In this single manipulator, dual buffer model, a ToC-based master controller receives input from the user preferences. It is contemplated that the preferences may be set by the user or derived from an external data source that tunes preferences based on historical trends and analytics over a broad range of test cell configurations and operating conditions. The master controller implements the algorithms of ToC as outlined earlier and controls the system by reprogramming the PID coefficients and allowing the PID controllers to regulate the manipulator speeds. From the perspective of the ToC controller, determination of where a constraint exists is extracted from the same data feeding the PID: transporter throughput, transporter wait times, buffer states, buffer rates of change, etc. The ToC controller then determines if a constraint can and should be removed by comparing what it wants to do against what is allowed by the user setting. If the constraint can be removed, then the ToC-controller changes the inputs to the PID controllers and allows them to regulate the transport speeds to achieve the desired result.

In the case where the master controller wants to slow down transport speeds in order to balance itself by synchronizing to the drumbeat, there is no need to check with the user preferences, as there is no penalty in throughput. As such, this ToC function is totally autonomous. None-the-less, the process is the same as that used to increase transport speeds: master program changes the inputs to the PID controllers and allows them to regulate the transport speeds to achieve the desired result.

The advantage of the various PID controllers being collectively controlled by the ToC master controller is that a drumbeat reference can be provided to synchronize all transport systems. This does require that the ToC master controller be able to calculate the throughput of the constraint.

The invention as described in this document represents a significant advance in the design of the semiconductor test cell. Systems and methods have been described that bring scientific methods to the optimization of throughput. As throughput is a long-term metric measured over the operational lifetime of test cell hardware, the issue of long-term reliability must be given equal importance to that of short-term improvements in throughput. The optimal balance between short-term throughput and mechanical stress must be found. By implementing the systems and methods described herein, this balance can be found algorithmically and tuned based on data instead of human speculation.

FIG. 12 illustrates an example of a computer 1200 on which the processes described above may be implemented. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer 1200 may be present in one of many physical configurations, including being configured as a server or as a client terminal. The computer 1200 may also be included in various devices, such as a desk-top computer, a laptop computer, a personal digital assistant, a mobile device, an electronic tablet, a smart phone, etc.

Figure 11:
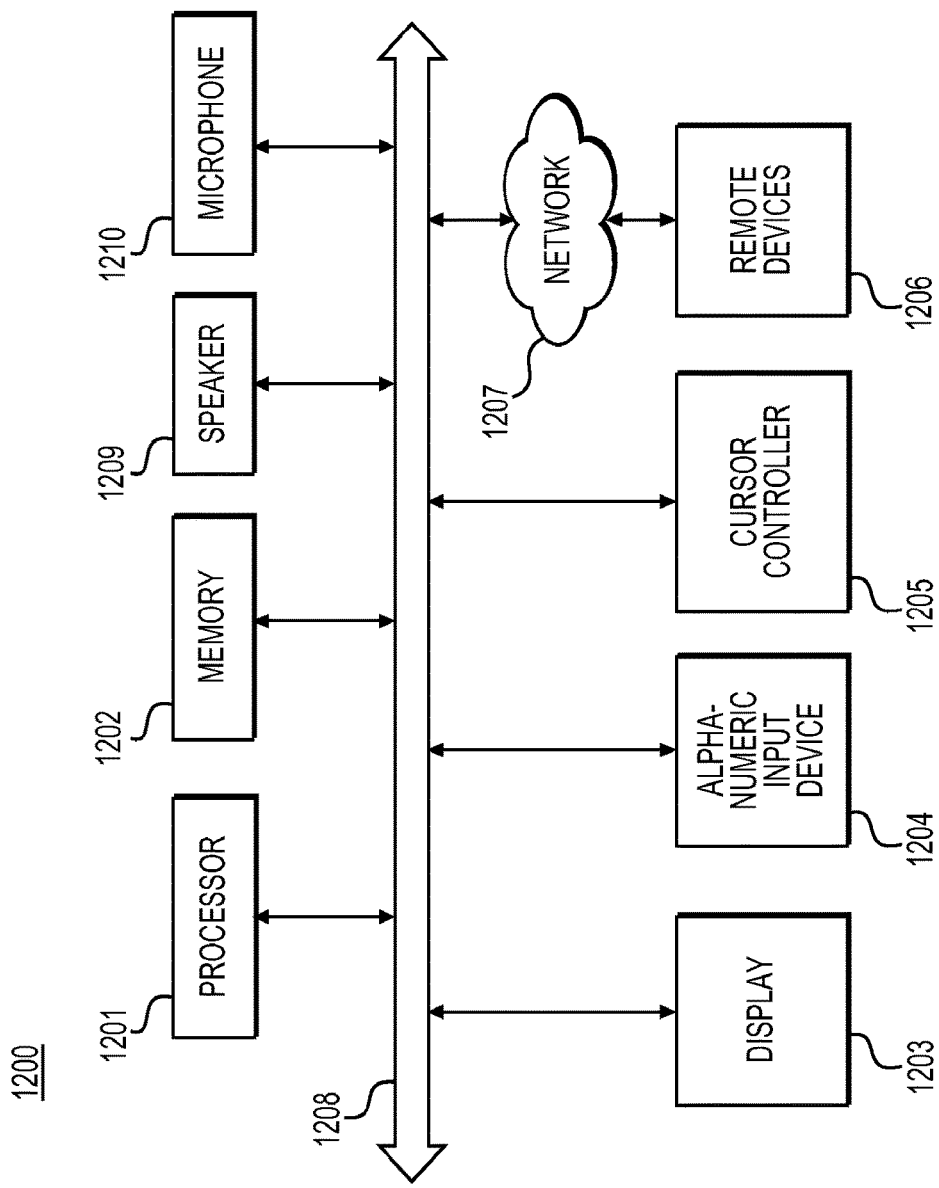
FIG. 11 illustrates an example of a computer system that may be utilized in implementing the herein described semiconductor testing.

As illustrated in FIG. 11, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily uses bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for optimizing operational throughput for a semiconductor device handler, the method comprising:
    receiving semiconductor devices for testing at a binned semiconductor device handler input carrier buffer;
    operating the semiconductor device handler in the testing of semiconductor devices for a predetermined period of time;
    recording, in an electronic memory, operational throughput characteristics for each operational stage of the semiconductor device handler;
    analyzing, by a computer, recorded operational throughput characteristics for each operational stage of the semiconductor device handler;
    determining, by the computer, which operational stage of the semiconductor device handler has the most limiting constraint causing a lowest operational drumbeat;
    adjusting operational parameters of the operational stage of the semiconductor device handler that has the lowest operational drumbeat to increase the operational drumbeat; and
    repeating the method until an operational state is achieved such that further adjustments to operational parameters result in a decrease in the operational throughput for the semiconductor device handler.

2. The method according to claim 1, further comprising:
    when the operational stage of the semiconductor device handler that has the lowest operational drumbeat is determined to be a semiconductor transport operation, further determining, by the computer, whether increasing the speed of the semiconductor transport operation would exceed operational limitations of the semiconductor transport operation, by the computer accessing stored operational characteristics of components of the semiconductor transport operation, which are stored in the electronic memory.

3. The method according to claim 2, further comprising:
    increasing the speed of the semiconductor transport operation a predetermined incremental amount, when the computer determines that increasing the speed of the semiconductor transport operation would not exceed operational limitations of the semiconductor transport operation.

4. The method according to claim 2, further comprising:
    decreasing the speed of all other operational stages of the semiconductor device handler to match the speed of the semiconductor transport operation, when the computer determines that increasing the speed of the semiconductor transport operation would exceed operational limitations of the semiconductor transport operation.

5. The method according to claim 1, further comprising:
    when the operational stage of the semiconductor device handler that has the lowest operational drumbeat is determined to be a soak buffer operation, decreasing the speed of all other operational stages of the semiconductor device handler to match the throughput of the soak buffer operation.

6. The method according to claim 1,
    wherein the operational stages of the semiconductor device handler include an input transport stage, a soak buffer stage, a core testing operation stage, and an output stage.

7. The method according to claim 1, the method further comprising:
    tuning all core manipulators of the semiconductor device handler to be synchronized with each other, when the semiconductor device handler includes a plurality of core manipulators.

8. The method according to claim 7, the method further comprising:
    when any one of the plurality of the core manipulators is determined to have a wait time by pausing and waiting for another core manipulator to complete an operation, slowing the speed of at least one of the plurality of the core manipulators to minimize the wait time.

9. The method according to claim 3,
    wherein in the determining whether increasing the speed of the semiconductor transport operation would exceed operational limitations of the semiconductor transport operation, the stored operational characteristics of the semiconductor transport operation include acceptable operational ranges of velocity, acceleration, and jerk.

10. The method according to claim 9,
    wherein increasing the speed of the semiconductor transport operation a predetermined incremental amount is based on a determination of a fastest speed of the semiconductor transport operation limited by a predetermined maximum value for speed, acceleration, and jerk.

11. The method according to claim 1, further comprising:
    the operational throughput characteristics for each operation stage of the semiconductor device handler are stored in a performance database accessible to the computer, the computer being able to perform both predetermined operational throughput analysis and user-customized operational throughput analysis for the semiconductor device handler.

12. The method according to claim 11, further comprising:
    issuing user alerts, by the computer, when the computer determines that the operational throughput of the semiconductor handler device is lower than a predetermined level of operational throughput.

13. The method according to claim 11, further comprising:

conducting continuous analysis of operational throughput characteristics for each operational stage of the semiconductor device handler by analyzing data stored in the performance database, determining an abnormal operational throughput characteristic for an operational stage of the semiconductor device handler, and predicting a future failure of an operational stage of the semiconductor device handler.

14. The method according to claim 1, further comprising:
the operating the semiconductor device handler is conducted in a non-production operational mode under various sets of conditions, wherein resulting operational throughput characteristics are used by the computer to generate a recommended semiconductor device handler configuration.

15. The method according to claim 1,
wherein each operational stage of the semiconductor device handler is regulated by a digital PID controller.

16. The method according to claim 1, the method further comprising:
increasing an index time of a semiconductor transport operation when the semiconductor device handler includes an indexless handler transport system and when it is determined by the computer that a semiconductor test time is longer than the index time.

17. A semiconductor device handler system for optimizing operational throughput, the system comprising:
a receiving buffer that receives semiconductor devices for testing;
an input buffer that input stages the semiconductor devices prior to testing;
a core testing station, including at least one manipulator, that tests the semiconductor devices;
an output buffer for output staging the semiconductor devices after testing;
carrier buffer for storing semiconductor devices after output staging;
a transport system for transporting the semiconductor devices through the system;
a controller that controls operations of the system, including analyzing operational throughput characteristics for each operational stage of the system, determining which operational stage has the lowest operational drumbeat, adjusting operational parameters of the operational stage that has the lower operational drumbeat to increase the drumbeat, and determining when further adjustments to operational parameters would not result in a decrease in the operational throughput.

18. The system according to claim 17,
wherein the input buffer includes a soak buffer that increases the temperature of the semiconductor devices prior to testing.

19. The system according to claim 17,
wherein the controller is a master digital PID controller, and each operational stage of the system is regulated by a digital PID controller that interacts with the master digital PID controller.

20. The system of claim 17,
wherein the core testing station includes a plurality indexless core manipulators.

* * * * *